(12) United States Patent
Ohmaru

(10) Patent No.: US 9,496,022 B2
(45) Date of Patent: Nov. 15, 2016

(54) SEMICONDUCTOR DEVICE INCLUDING POWER MANAGEMENT UNIT FOR REFRESH OPERATION

(71) Applicant: Semiconductor Energy Laboratory Co., Ltd., Atsugi-shi, Kanagawa-ken (JP)

(72) Inventor: Takuro Ohmaru, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/723,613

(22) Filed: May 28, 2015

(65) Prior Publication Data

US 2015/0348609 A1 Dec. 3, 2015

(30) Foreign Application Priority Data

May 29, 2014 (JP) ................................. 2014-111000

(51) Int. Cl.
*G11C 7/00* (2006.01)
*G11C 11/406* (2006.01)
(Continued)

(52) U.S. Cl.
CPC ............ *G11C 11/406* (2013.01); *G11C 11/401* (2013.01); *G11C 11/404* (2013.01); *G11C 11/4074* (2013.01); *G11C 11/4076* (2013.01); *G11C 29/24* (2013.01); *G11C 29/42* (2013.01);
(Continued)

(58) Field of Classification Search
CPC . G11C 11/406; G11C 11/4074; G11C 5/147; G11C 11/4076

USPC ................. 365/222, 226, 149, 189.07, 233.1
See application file for complete search history.

(56) References Cited

U.S. PATENT DOCUMENTS 4,466,081 A 8/1984 Masuoka
4,777,625 A 10/1988 Sakui et al.
(Continued)

FOREIGN PATENT DOCUMENTS

EP 1737044 A 12/2006
EP 2226847 A 9/2010
(Continued)

OTHER PUBLICATIONS

Kim. H et al., "Three-Dimensional Integration Approach to High-Density Memory Devices", IEEE Transactions on Electron Devices, vol. 58, No. 11, Nov. 2011, pp. 3820-3828.
(Continued)

*Primary Examiner* — David Lam
(74) *Attorney, Agent, or Firm* — Fish & Richardson P.C.

(57) ABSTRACT

To provide a novel semiconductor device. The semiconductor device includes a circuit including a memory cell including a transistor using an oxide semiconductor; and a refresh timing determination unit including a capacitor, a transistor using an oxide semiconductor, and a comparator circuit. The potential of a floating node in the refresh timing determination unit is directly or indirectly input to the comparator circuit and compared with a reference potential. When the potential of the floating node becomes a certain value, a power switch operating in accordance with an output of the comparator circuit is turned on, power is supplied to the circuit including the memory cell, and then the reference potential is also changed. After that, refresh operation of the memory cell is performed. When the refresh operation is finished, the power switch is turned off.

20 Claims, 14 Drawing Sheets

(51) Int. Cl.

| | | |
|---|---|---|
| *G11C 11/4076* | (2006.01) | |
| *G11C 11/4074* | (2006.01) | |
| *G11C 11/401* | (2006.01) | |
| *G11C 29/24* | (2006.01) | |
| *G11C 29/42* | (2006.01) | |
| *G11C 29/50* | (2006.01) | |
| *G11C 11/404* | (2006.01) | |
| *G11C 5/14* | (2006.01) | |

(52) U.S. Cl.
CPC ......... *G11C 29/50016* (2013.01); *G11C 5/147* (2013.01)

(56) References Cited

U.S. PATENT DOCUMENTS

| | | |
|---|---|---|
| 5,278,797 A | 1/1994 | Jeon et al. |
| 5,349,366 A | 9/1994 | Yamazaki et al. |
| 5,528,032 A | 6/1996 | Uchiyama |
| 5,731,856 A | 3/1998 | Kim et al. |
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,314,017 B1 | 11/2001 | Emori et al. |
| 6,327,210 B1 | 12/2001 | Kuroda et al. |
| 6,445,026 B1 | 9/2002 | Kubota et al. |
| 6,536,013 B2 | 3/2003 | Kobayashi et al. |
| 6,563,174 B2 | 5/2003 | Kawasaki et al. |
| 6,727,522 B1 | 4/2004 | Kawasaki et al. |
| 6,804,142 B2 | 10/2004 | Forbes |
| 7,027,326 B2 | 4/2006 | Luk et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,992 B2 | 3/2007 | Wager, III et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,375,399 B2 | 5/2008 | Ishii et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,440,334 B2 | 10/2008 | Barth et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,468,901 B2 | 12/2008 | Kameshiro et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,859,889 B2 | 12/2010 | Kameshiro et al. |
| 7,884,360 B2 | 2/2011 | Takechi et al. |
| 8,369,172 B2 * | 2/2013 | Pu .......................... G11C 7/22 365/189.05 |
| 8,406,038 B2 | 3/2013 | Saito et al. |
| 8,451,651 B2 | 5/2013 | Matsuzaki et al. |
| 8,530,246 B2 | 9/2013 | Ofuji et al. |
| 9,001,563 B2 | 4/2015 | Atsumi et al. |
| 9,007,813 B2 | 4/2015 | Saito et al. |
| 9,129,703 B2 | 9/2015 | Saito |
| 2001/0046027 A1 | 11/2001 | Tai et al. |
| 2002/0039316 A1 | 4/2002 | Tobita |
| 2002/0056838 A1 | 5/2002 | Ogawa |
| 2002/0132454 A1 | 9/2002 | Ohtsu et al. |
| 2003/0123313 A1 | 7/2003 | Hanzawa et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0062071 A1 | 4/2004 | Rodriguez et al. |
| 2004/0127038 A1 | 7/2004 | Carcia et al. |
| 2004/0266088 A1 | 12/2004 | Luyken et al. |
| 2005/0017302 A1 | 1/2005 | Hoffman |
| 2005/0073871 A1 | 4/2005 | Luk et al. |
| 2005/0128803 A1 | 6/2005 | Luk et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065842 A1 | 3/2010 | Yamazaki et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0165704 A1 | 7/2010 | Wu et al. |
| 2011/0042677 A1 | 2/2011 | Suzuki et al. |
| 2011/0122673 A1 | 5/2011 | Kamata et al. |
| 2011/0156117 A1 | 6/2011 | Yamazaki et al. |
| 2011/0205774 A1 | 8/2011 | Takemura |
| 2011/0210339 A1 | 9/2011 | Yamazaki et al. |
| 2012/0033483 A1 | 2/2012 | Koyama |
| 2012/0039126 A1 | 2/2012 | Saito |

(56) References Cited

U.S. PATENT DOCUMENTS

| | | |
|---|---|---|
| 2012/0069634 A1 | 3/2012 | Saito |
| 2015/0145559 A1 | 5/2015 | Kozuma |
| 2015/0213842 A1 | 7/2015 | Atsumi et al. |
| 2015/0262642 A1 | 9/2015 | Koyama |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-205465 | 8/1993 |
| JP | 05-251705 A | 9/1993 |
| JP | 06-125084 | 5/1994 |
| JP | 07-211084 | 8/1995 |
| JP | 07-254272 | 10/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-053164 | 2/2001 |
| JP | 2002-076356 A | 3/2002 |
| JP | 2002-269979 | 9/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-287887 | 11/2008 |
| JP | 2010-003910 | 1/2010 |
| WO | WO-2004/114391 | 12/2004 |

OTHER PUBLICATIONS

Yang-Shun Fan and al., "Indium—Gallium—Zinc—Oxide Based Resistive Switching Memory for System-on-Glass Application", Proceedings of IDW'11, The 18th International Display Workshops, Dec. 7-9, 2011, pp. 575-577.

Kim. K., "Technology for sub-50nm DRAM and NAND Flash Manufacturing", IEDM 05: Technical Digest of International Electron Devices Meeting, Dec. 5, 2005, pp. 333-336.

Mueller. W. et al., "Challenges for the DRAM Cell Scaling to 40nm", IEDM 05: Technical Digest of International Electron Devices Meeting, Jan. 1, 2005, pp. 347-350.

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Ishii.T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim.W et al., "An Experimental High-Density DRAM Cell with a Built-in Gain Stage," IEEE Journal of Solid-State Circuits, Aug. 1, 1994, vol. 29, No. 8, pp. 978-981.

Shukuri.S et al., "A Complementary Gain Cell Technology for sub-1 V Supply DRAMs," IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Asakuma.N et al., "Crystallization and Reduction of SOL-GEL-Derived Zinc Oxide Films by Irradiation With Ultraviolet Lamp," Journal of SOL-GEL Science and Technology, 2003, vol. 26, pp. 181-184.

Asaoka.Y et al., "29.1:Polarizer-Free Reflective LCD Combined With Ultra Low-Power Driving Technology," SID Digest '09 : SID International Symposium Digest of Technical Papers, 2009, pp. 395-398.

Chern.H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho.D et al., "21.2:Al and SN-Doped Zinc Indium Oxide Thin Film Transistors for AMOLED Back-Plane," SID Digest '09: SID International Symposium Digest of Technical Papers, May 31, 2009, pp. 280-283.

Clark.S et al., "First Principles Methods Using CASTEP," Zeitschrift fur Kristallographie, 2005, vol. 220, pp. 567-570.

Coates.D et al., "Optical Studies of the Amorphous Liquid-Cholesteric Liquid Crystal Transition: The "Blue Phase,"" Physics Letters, Sep. 10, 1973, vol. 45A, No. 2, pp. 115-116.

Costello.M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo.H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi.R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS," J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT," SID Digest '07 : SID International Symposium Digest of technical Papers, 2007, vol. 38, pp. 1830-1833.

Hsieh.H et al., "P-29:Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda.T et al., "Full-Functional System Liquid Crystal Display Using CG-Silicon Technology," SID Digest '04 : SID International Symposium Digest of Technical Papers, 2004, vol. 35, pp. 860-863.

Janotti.A et al., "Native Point Defects in ZnO," Phys. Rev. B (Physical Review. B), 2007, vol. 76, No. 16, pp. 165202-1-165202-22.

Janotti.A et al., "Oxygen Vacancies in ZnO," Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin.D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

(56) References Cited

OTHER PUBLICATIONS

Kanno.H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications," SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi.H et al., "Polymer-Stabilized Liquid Crystal Blue Phases," Nature Materials, Sep. 2, 2002, vol. 1, pp. 64-68.

Kim.S et al., "High-Performance oxide thin film transistors passivated by various gas plasmas," 214th ECS Meeting, 2008, No. 2317, ECS Kimizuka.N et al., "Spinel,YbFe2O4, and Yb2Fe3O7 Types of Structures for Compounds in the In2O3 and Sc2O3—A2O3-BO Systems [A; Fe, Ga, or Al; B: Mg, Mn, Fe, Ni, Cu, or Zn] At Temperatures Over 1000° C.," Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow.H et al., "Observation of Blue Phases in Chiral Networks," Liquid Crystals, 1993, vol. 14, No. 3, pp. 911-916.

Kurokawa.Y et al., "UHF RFCPUS on Flexible and Glass Substrates for Secure RFID Systems," Journal of Solid-State Circuits, 2008, vol. 43, No. 1, pp. 292-299.

Lany.S et al., "Dopability, Intrinsic Conductivity, and Nonstoichiometry of Transparent Conducting Oxides," Phys. Rev. Lett. (Physical Review Letters), Jan. 26, 2007,vol. 98, pp. 045501-1-045501-4.

Lee.H et al., "Current Status of, Challenges to, and Perspective View of AM-OLED," IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee.M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda.S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka.M, "SUFTLA Flexible Microelectronics on Their Way to Business," SID Digest '07 : SID International Symposium Digest of Technical Papers, 2007, vol. 38, pp. 1673-1676.

Mo.Y et al., "Amorphous Oxide TFT Backplanes for Large Size AMOLED Displays," IDW '08 : Proceedings of the 6th International Display Workshops, Dec. 3, 2008, pp. 581-584.

Nakamura.M et al., "The phase relations in the In2O3—Ga2ZnO4—ZnO system at 1350 ° C.," Journal of Solid State Chemistry, Aug. 1, 1991, vol. 93, No. 2, pp. 298-315.

Nakamura.M, "Synthesis of Homologous Compound with New Long-Period Structure," NIRIM Newsletter, Mar. 1995, vol. 150, pp. 1-4 with English translation.

Nomura.K et al., "Amorphous Oxide Semiconductors for High-Performance Flexible Thin-Film Transistors," JPN. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors," Nature, Nov. 25, 2004, vol. 432, pp. 488-492.

Nomura.K et al., "Thin-Film Transistor Fabricated in Single-Crystalline Transparent Oxide Semiconductor," Science, May 23, 2003, vol. 300, No. 5623, pp. 1269-1272.

Nowatari.H et al., "60.2: Intermediate Connector With Suppressed Voltage Loss for White Tandem OLEDS," SID Digest '09: SID International Symposium Digest of Technical Papers, May 31, 2009, vol. 40, pp. 899-902.

Oba.F et al., "Defect energetics in ZnO: A hybrid Hartree-Fock density functional study," Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara.H et al., "21.3: 4.0 In. QVGA AMOLED Display Using In—Ga—Zn—Oxide TFTs with a Novel Passivation Layer," SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display,"AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor," Philosophical Magazine, 2001, vol. 81, No. 5, pp. 501-515.

Orita.M et al., "Mechanism of Electrical Conductivity of Transparent InGaZnO4," Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT," AM-FPD '09 Digest of Technical Papers, Jul. 1, 2009, pp. 33-36.

Park.J et al., "Amorphous Indium—Gallium—Zinc Oxide TFTs and Their Application for Large Size AMOLED," AM-FPD '08 Digest of Technical Papers, Jul. 2, 2008, pp. 275-278.

Park.J et al., "Dry etching of ZnO films and plasma-induced damage to optical properties" J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park.J et al., "High performance amorphous oxide thin film transistors with self-aligned top-gate structure," IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT," IMID '07 Digest, 2007, pp. 1249-1252.

Park.Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

(56) References Cited

OTHER PUBLICATIONS

Prins.M et al., "A Ferroelectric Transparent Thin-Film Transistor," Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Takahashi.M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda.K et al., "Ultra Low Power Consumption Technologies for Mobile TFT-LCDs," IDW '02 : Proceedings of the 9th International Display Workshops, Dec. 4, 2002, pp. 295-298.

Ueno.K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

SEMICONDUCTOR DEVICE INCLUDING POWER MANAGEMENT UNIT FOR REFRESH OPERATION

BACKGROUND OF THE INVENTION

1. Field of the Invention

This disclosure relates to a semiconductor device provided with a circuit including a semiconductor element such as a transistor, and a method for driving the semiconductor device.

2. Description of the Related Art

A memory cell which can retain data by using an oxide semiconductor transistor without performing refresh operation for a long time is proposed. In such a memory cell, an adequate time is required until next refresh operation is performed; therefore, unlike a conventional DRAM using a silicon transistor, it does not mean that the memory cell simply requires regular-interval refresh operation. Patent Documents 1 to 3 disclose techniques with consideration of such peculiarity.

REFERENCE

Patent Document

[Patent Document 1] U.S. Pat. No. 8,406,038
[Patent Document 2] United States Published Patent Application No. 2012/0039126
[Patent Document 3] United States Published Patent Application No. 2012/0275214

SUMMARY OF THE INVENTION

This disclosure achieves any one of the following objects: to provide a semiconductor device capable of performing efficient refresh operation; to provide a method for driving a semiconductor device capable of performing efficient refresh operation; to provide a novel semiconductor device; to provide a method for driving the novel semiconductor device; and an explicitly or implicitly described object.

One embodiment disclosed in this specification is a semiconductor device which includes a circuit including a plurality of memory cells each of which includes a first capacitor and a first transistor using an oxide semiconductor (circuit including a memory); a refresh timing determination unit including a reference cell including a second capacitor and a second transistor using an oxide semiconductor, and a comparator or a latch; and a power management unit. The refresh timing determination unit outputs a signal in accordance with a change in the potential of the second capacitor. A switch for power supply is provided for each of the circuit including the memory and the power management unit and is opened/closed in accordance with the output signal of the refresh timing determination unit. Here, in the case where the switches of the circuit including the memory and the power management unit are turned on, the power management unit transmits a signal (refresh signal) for starting refresh operation to the circuit including the memory, and the circuit including the memory performs refresh operation on the whole or some of the memory cells in accordance with the refresh signal. For example, the semiconductor device includes a circuit including memory cells each of which includes a first capacitor and a first transistor using an oxide semiconductor and in which a potential corresponding to data is supplied to the first capacitor through the first transistor; a refresh timing determination unit including a second capacitor, a second transistor using an oxide semiconductor, and a comparator circuit; a power management unit; and a power switch for controlling power supply to the circuit. The potential of a first electrode of the second capacitor is substantially equal to the potential of one of a source electrode and a drain electrode of the second transistor. The comparator circuit is supplied with a first potential changed in accordance with the potential of the first electrode of the second capacitor and a second potential, and compares the first potential and the second potential to change an output potential. The value of the second potential depends on whether power is supplied to the circuit or not. The output potential is output as a first signal directly or through another circuit. The power switch is controlled by the first signal. When power is supplied to the circuit by turning on the power switch, data of the memory cell is refreshed. The power management unit is set so as to change the potential of the other of the source electrode and the drain electrode of the second transistor and the potential of a gate electrode of the second transistor in accordance with a second signal transmitted from the circuit. However, another semiconductor device may be employed. The details will be described later.

According to the above embodiment, a semiconductor device capable of performing efficient refresh operation and a driving method thereof can be provided. According to other embodiments disclosed in this specification, other effects can be obtained. For example, a novel semiconductor device can be provided, a method for driving the novel semiconductor device can be provided, or an explicitly or implicitly described object can be achieved.

DETAILED DESCRIPTION OF THE INVENTION

Figure 1:
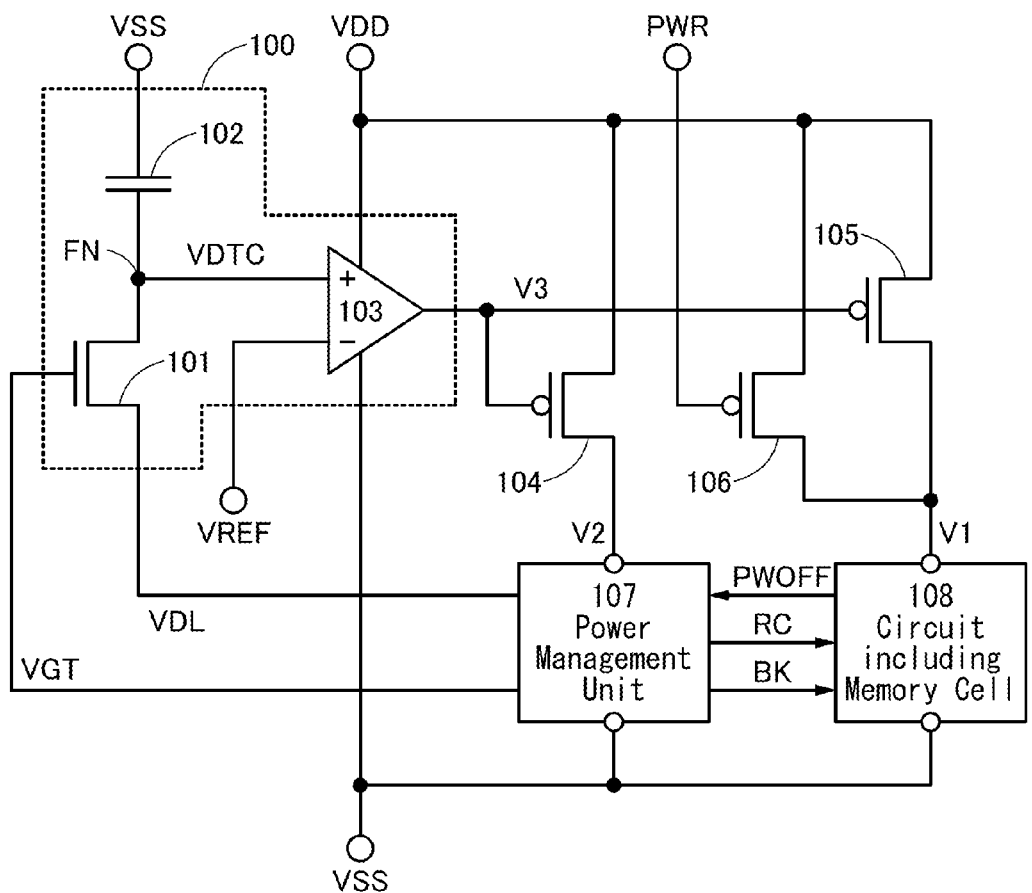
FIG. 1 is a circuit diagram illustrating an example of a semiconductor device.

Hereinafter, embodiments are described in detail with reference to the drawings. However, the embodiments are not limited to the description below, and it is easily understood by those skilled in the art that modes and details disclosed herein can be modified in various ways without departing from the spirit and the scope of the present invention. One or more features described below may be combined with another one or more features. In describing structures of the embodiments with reference to the drawings, the same reference numerals are used in common for the same portions in different drawings. Note that the same hatched pattern is applied to similar parts, and the similar parts are not especially denoted by reference numerals in some cases.

In this specification, when one of a source (or a source electrode) and a drain (or a drain electrode) of a transistor is called a drain (or a drain electrode), the other is called a source (or a source electrode). That is, they are not distinguished depending on the potential level. Therefore, a portion called a source (or a source electrode) can be alternatively referred to as a drain (or a drain electrode).

<Example of Semiconductor Device>

FIG. 1 is an example of a semiconductor device. The semiconductor device includes a refresh timing determination unit 100, a power management unit 107, and a circuit 108 including memory cells. The circuit 108 includes a plurality of memory cells using the oxide semiconductor disclosed in Patent Documents 1 to 3. For example, the plurality of memory cells are provided in a matrix, and may be arranged in a linear shape, a spiral shape, a concentric shape, or the like. Examples of the circuit 108 include a memory and a processor (including a CPU).

The refresh timing determination unit 100 includes a transistor 101, a capacitor 102, and a comparator circuit 103. The transistor 101 and the capacitor 102 are configured so that the potentials of three portions, i.e., a source electrode and a drain electrode of the transistor 101 and one electrode of the capacitor 102, are substantially equal when the transistor 101 is on. For example, the source electrode of the transistor 101 is connected to the one electrode of the capacitor 102. Such a connection portion is referred to as a floating node FN. A structure similar to the connection portion is provided in a memory cell included in the circuit and is referred to as a memory node MN. The potential of the other electrode of the capacitor 102 is maintained at VSS, but may be another potential.

The transistor 101 preferably has a structure similar to that of a transistor using an oxide semiconductor used in the circuit 108, for example. Specifically, the transistor 101 and the transistor preferably have the same channel length and the same channel width. Oxide semiconductors having the same composition and subjected to the same process are preferably used for the transistor 101 and the transistor, for example. The capacitor 102 preferably has the same capacitance as a capacitor used in the circuit 108, for example. A circuit including the transistor 101 and the capacitor 102 preferably has the same or substantially the same characteristics as a memory cell including the transistor using an oxide semiconductor in the circuit 108, for example. Specifically, the same or substantially the same writing time is preferably set.

Thus, the circuit including the transistor 101 and the capacitor 102 can faithfully reproduce the state of the memory cell including the transistor using an oxide semiconductor in the circuit 108, so that the reliability can be increased.

As the transistor 101, a transistor expected to have the worst characteristics over a chip may be used. For example, a transistor expected to have a lower off-state resistance than the transistor using an oxide semiconductor in the circuit 108 is used. Transistors on four corners of a memory cell array in the circuit 108 may be used.

The potential (detection potential VDTC) of the one electrode of the capacitor 102 is input to the comparator circuit 103. The comparator circuit 103 compares the detection potential VDTC and a reference potential VREF. For example, the comparator circuit 103 outputs a high potential (e.g., VDD) when the detection potential VDTC is higher than the reference potential VREF, and outputs a low potential (e.g., VSS) when the detection potential VDTC is lower than the reference potential VREF. Hereinafter, VDD is higher than VSS. Although an output potential V3 of the comparator circuit 103 is an output of the refresh timing determination unit 100 in this example, the output of the comparator circuit 103 may be input to any circuit and the output of the circuit may be the output of the refresh timing determination unit 100. The comparator circuit 103 is supplied with power, e.g., VDD and VSS.

Since the transistor 101 is a transistor using the oxide semiconductor disclosed in Patent Documents 1 to 3, the transistor 101 has an extremely high off-state resistance (extremely low off-state current). However, after time passes sufficiently, the potential (detection potential VDTC) of the source electrode of the transistor 101 is closer to the potential of the drain electrode thereof. For example, when the potential of the drain electrode of the transistor 101 is maintained at lower than the initial potential of the source electrode after the transistor 101 is turned off, the detection potential VDTC is decreased and becomes close to the potential of the drain electrode. In the case where the potential of the source electrode is set to VDD and the potential of the drain electrode is set to VSS when the transistor 101 is turned off, the potential of the source electrode is gradually lowered to be close to VSS after long time passes.

In the case where the reference potential VREF is set to an appropriate value, e.g., a potential between the potential of the drain electrode of the transistor 101 and the potential of the source electrode thereof when the transistor 101 is in an off state, the comparator circuit 103 initially outputs VDD because the detection potential VDTC is higher than the reference potential VREF. After that, when the detection potential VDTC is decreased and becomes "substantially equal" to the reference potential VREF, the comparator circuit 103 outputs VSS in some cases. Note that the comparator circuit 103 outputs VSS in the case where the detection potential VDTC is sufficiently lower than the reference potential VREF.

In this specification, "substantially equal" is determined by the accuracy of the comparator circuit 103. Strictly speaking, in some cases, the comparator circuit 103 outputs VSS even when the detection potential VDTC is higher than the reference potential VREF, and the comparator circuit 103 does not output VSS even when the detection potential VDTC is lower than the reference potential VREF.

In other words, when the difference between the detection potential VDTC and the reference potential VREF is substantially within the accuracy range of the comparator circuit 103, it is difficult for the comparator circuit 103 to reliably determine the levels of the detection potential VDTC and the reference potential VREF. Probabilistically the comparator circuit 103 may output VDD, VSS, or an intermediate potential therebetween. To avoid such an unstable state, a circuit which continuously outputs VSS regardless of the signal from the comparator circuit 103 after the comparator circuit 103 outputs VSS once until the circuit is reset may be connected to the output of the comparator circuit 103, and the output of the circuit may be the output of the refresh timing determination unit 100.

The power management unit 107 is supplied with VDD through a first power switch 104. The circuit 108 is supplied with VDD through a second power switch 105 and a third power switch 106. The first power switch 104, the second power switch 105, and the third power switch 106 are, for example, p-channel transistors.

The first power switch 104 and the second power switch 105 are controlled by the output of the refresh timing determination unit 100. For example, when the output of the refresh timing determination unit 100 is VDD, the first power switch 104 and the second power switch 105 are off, and when the output of the refresh timing determination unit 100 is VSS, the first power switch 104 and the second power switch 105 are on.

By comparing the detection potential VDTC and the reference potential VREF in such a manner, the first power switch 104 and the second power switch 105 can be turned on/off. The configuration including the transistor 101 and the capacitor 102 in the refresh timing determination unit 100 to obtain the detection potential VDTC is similar to that of a memory cell including a transistor using an oxide semiconductor which is described later; thus, a change in the detection potential VDTC (decrease in the above case) is similar to a change in the potential of the memory node in the memory cell.

Note that the memory cell and the refresh timing determination unit 100 are different, for example, in capacitance of a used capacitor. In the refresh timing determination unit 100, parasitic capacitance of a wiring between the source electrode of the transistor 101 and the comparator circuit 103 and the like need to be considered in addition to the capacitance of the capacitor 102 and input capacitance of the comparator circuit 103. In general, compared with a memory node of a memory cell, capacitance of a corresponding portion of the refresh timing determination unit 100 is large and a change in the detection potential VDTC per unit time becomes small.

In order that the operation of the corresponding portion of the refresh timing determination unit 100 is made close to the operation of the memory cell by compensating a decrease in a change in the detection potential VDTC per unit time, the off-state resistance of the transistor 101 is decreased or the reference potential VREF is set closer to the initial value of the detection potential VDTC, for example. As an example of the former, the channel width of the transistor 101 is increased or the channel length of the transistor 101 is decreased, for example. As an example of the latter, when the acceptable voltage variation in the memory node in the memory cell is 40% of the difference between VDD and VSS, the difference between the reference potential VREF and VSS is set to 95% of the difference between VDD and VSS, for example.

The reference potential VREF may be optimized in accordance with the characteristics of the memory cell. When the reference potential is too low, data retention failure might occur. In contrast, when the reference potential is too high, the frequency of refresh operation is increased. In the case where the reference potential VREF is optimized in accordance with the characteristics of the memory cell, data retention and a decrease in frequency of refresh operation can be achieved.

The characteristics of the memory cell are varied at a lot level, a wafer level, or a chip level in some cases because of variations in manufacturing steps and conditions, and the like. Therefore, on the basis of the results of manufacturing tests at the time of shipment, the reference potential VREF may be set for each lot, each wafer, or each chip.

A circuit which can determine an appropriate reference potential VREF may be provided in the semiconductor device. For example, data retention characteristics of the memory cell in the semiconductor device may be tested as needed and the reference potential VREF may be changed depending on the obtained retention characteristics. Specifically, a memory cell (test memory cell) having worse retention characteristics than a normal memory cell is provided. For example, the capacitance of the capacitor is smaller than that of the normal memory cell, the channel width of a transistor using an oxide semiconductor is larger than a normal channel width, or the channel length of the transistor using an oxide semiconductor is shorter than a normal channel length. This memory cell is not used for data retention generally.

Dummy data is written to the test memory cell and the normal memory cell and left. When data retention reaches its limit, power is supplied to the power management unit 107 and the circuit 108 by the refresh timing determination unit 100 and refresh operation for the memory cell is performed; however, in the test memory cell, refresh operation is not performed but data retained therein is examined. In the case where the retained data is different from the dummy data, the reference potential VREF is set slightly higher because the reference potential VREF might be too low. In the case where the retained data is the same as the dummy data, the reference potential VREF is set slightly lower because the reference potential VREF might be too high. In such a manner, an appropriate reference potential VREF is determined.

The reference potential VREF may be always a constant potential or a potential changed in accordance with the situation. For example, in the case where power is supplied to the circuit 108, the reference potential VREF may be automatically a constant first potential and in the case where power is not supplied to the circuit 108, the reference potential VREF may be automatically a constant second potential. More specifically, in the case where power is supplied to the circuit 108, the reference potential VREF may be set to VDD (or a potential slightly lower than VDD) and in the case where power is not supplied to the circuit 108, the reference potential VREF may be set to a potential lower than the potential in the case of supplying power to the circuit 108.

The third power switch 106 is controlled by a control signal PWR. Thus, the circuit 108 can operate independently of the output of the refresh timing determination unit 100. The following structure may be employed: after power is supplied to the circuit 108 once, the second power switch 105 (first power switch 104 if necessary) is also turned on, and even when the third power switch 106 is off, the second power switch 105 remains on until another signal (control signal PWOFF described later or the like) is input to the power management unit 107.

Although the first power switch 104 to the third power switch 106 are provided between the power management unit 107 or the circuit 108 and wirings for supplying VDD in the above example, they can be provided between the power management unit 107 or the circuit 108 and wirings for supplying VSS. In such a case, the first power switch 104 to the third power switch 106 are preferably n-channel transistors. Thus, the comparator circuit 103 is preferably configured or designed so that VDD is output as its output potential V3 when the detection potential VDTC is decreased.

A plurality of power switches having different polarities may be provided for blocks in the power management unit 107 or the circuit 108. For example, in the case where a memory cell array, a bit line driver, and a word line driver are provided in the circuit 108, power supply to the word line driver is controlled by the power switch (p-channel transistor) connected to VDD, and power supply to the bit line driver and the other circuits is controlled by the power switch (n-channel transistor) connected to VSS.

In the above structure, when power supply is not performed, the potentials of most part of the word line driver and the word line are set to VSS and the potentials of most part of the bit line driver and the other circuits are set to VDD. The use of such potentials improves retention characteristics of the memory cell. The details will be described later.

In the case where the first power switch 104 is off, a gate potential VGT and a drain potential VDL which are output from the power management unit 107 are VDD. In view of this, an inverter is preferably provided between the power management unit 107 and the refresh timing determination unit 100 so that the potential of a signal input from the power management unit 107 to the refresh timing determination unit 100 is set to VSS in the case where power is not supplied to the power management unit 107.

<Operation Example>

Figure 2:
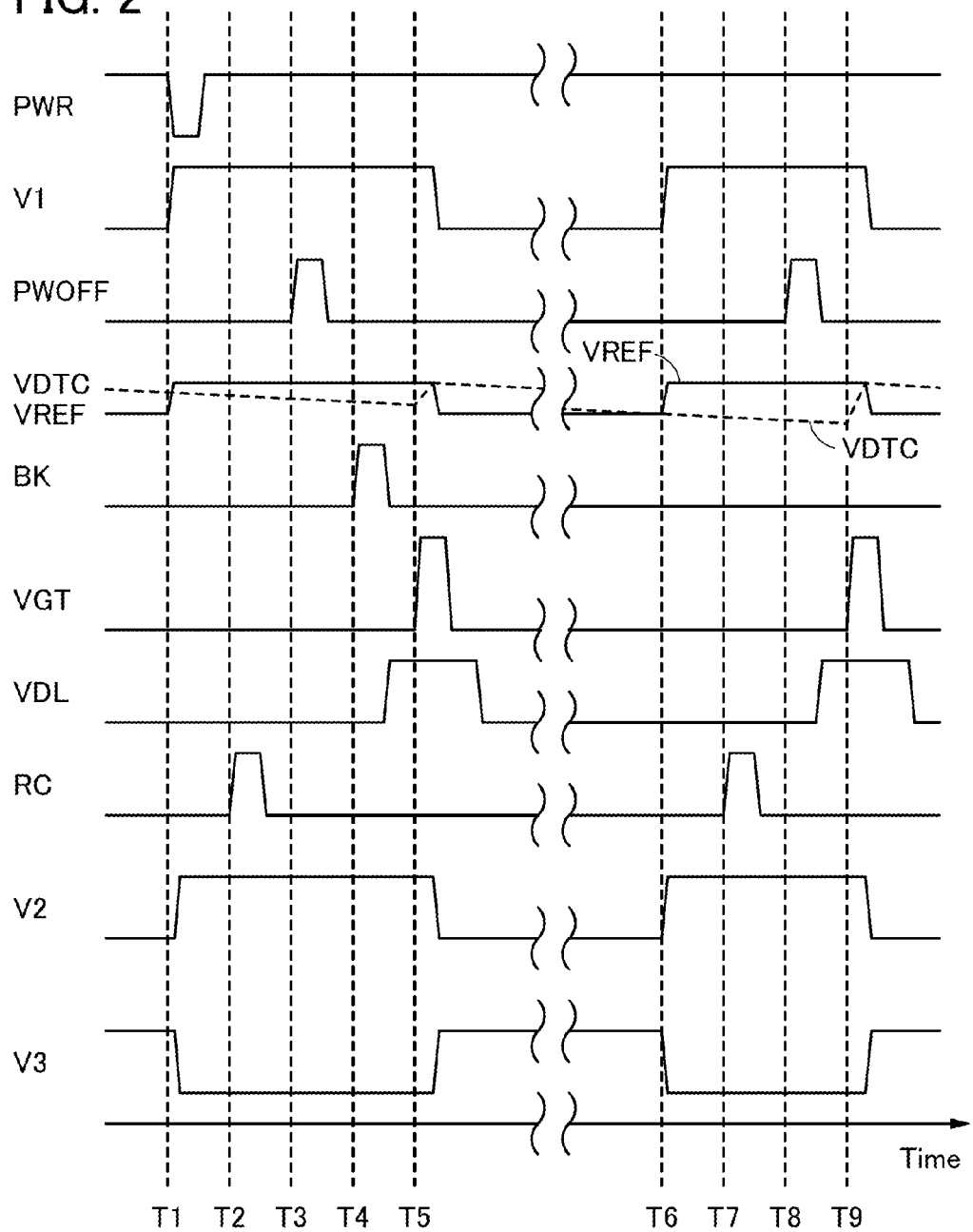
FIG. 2 is a timing chart illustrating an operation example of a semiconductor device.

An operation example of the semiconductor device illustrated in FIG. 1 is described using a timing chart in FIG. 2. In this example, in the case where power is supplied to the circuit 108, the reference potential VREF is set to VDD, and in the case where power is not supplied to the circuit 108, the reference potential VREF is set to a potential higher than VSS and lower than VDD (hereinafter referred to as a potential VDS). The reference potential VREF is changed without long delay from the change in the potential V1.

Before Time T1, the detection potential VDTC (shown by a dotted line) is higher than the reference potential VREF (shown by a solid line) and lower than VDD. Accordingly, the output potential V3 of the comparator circuit 103 is VDD, the first power switch 104 and the second power switch 105 are off, and the potential V1 and the potential V2 are VSS.

First, at Time T1, the control signal PWR is decreased from VDD to VSS. Thus, the third power switch 106 is turned on and power is supplied to the circuit 108 (the potential V1 is set to VDD). At the same time, the reference potential VREF is increased from VDS to VDD (the reference potential VREF becomes higher than the detection potential VDTC). Consequently, the output potential V3 of the comparator circuit 103 is set to VSS, and the first power switch 104 and the second power switch 105 are turned on a little later than the timing when the third power switch 106 is turned on. That is, power is also supplied to the power management unit 107 (the potential V2 is set to VDD).

In some cases, any signal is automatically output from these owing to power supply to the power management unit 107 and the circuit 108, or any signal is output from these owing to reception of a signal from another circuit or the like; however, only main signals are described below.

After that, the control signal PWR is set to VDD and the third power switch 106 is turned off, while the second power switch 105 is turned on; thus, the reference potential VREF remains VDD and the output potential V3 of the comparator circuit 103 can remain VSS. Accordingly, the first power switch 104 and the second power switch 105 remain on, so that power supply to the power management unit 107 and the circuit 108 can be performed continuously and stably.

At Time T2, a control signal RC is transmitted from the power management unit 107 to the circuit 108. The circuit 108 which receives the control signal RC rewrites data (performs refresh operation) in the memory including a transistor using an oxide semiconductor. Here, although the control signal RC is automatically transmitted when a certain time passes after power is supplied to the power management unit 107, refresh operation is not necessarily performed at this timing.

At Time T3, the control signal PWOFF for temporarily stopping the power supply is transmitted from the circuit 108 to the power management unit 107. The power supply is stopped to reduce power consumption by stopping unnecessary power supply, i.e., to perform power gating, in some cases. The control signal PWOFF may be transmitted from another circuit except the circuit 108 to the power management unit 107. The control signal PWOFF may be transmitted in the case where effective arithmetic processing or processing such as data writing/reading is not performed for a certain period, for example.

After that, at Time T4, the power management unit 107 transmits a control signal BK to the circuit 108. The circuit 108 performs backup of data with the control signal BK. The backup of data means that data stored in a volatile memory is transferred to a memory including a transistor using an oxide semiconductor, for example.

The backup is not necessary in the case where a memory other than a memory including a transistor using an oxide semiconductor is not provided in the circuit 108, the case where data has already been backed up to a memory including a transistor using an oxide semiconductor, the case where effective data is not retained in a memory other than a memory including a transistor using an oxide semiconductor, or the case where the circuit 108 is designed so that data stored in a volatile memory is not transferred to another memory.

Depending on the type of the circuit 108, backup operation is the same as refresh operation or part of refresh operation serves as backup operation in some cases.

Since the power management unit 107 determines whether backup of data is necessary or not and transmits the control signal BK, the power management unit 107 does not transmit the control signal BK in some cases.

Other than the case where the power management unit 107 transmits the control signal BK, the backup operation can be completed in the circuit 108. In other words, the circuit 108 may perform backup operation without involvement of the power management unit 107 and transmit the control signal PWOFF to the power management unit 107 after the backup operation.

At Time T5, the power management unit 107 sets the gate potential VGT to a potential (VDDH) at which the transistor 101 is turned on. Since an oxide semiconductor is used in the transistor 101, VDDH is higher than VDD in some cases. In the example in FIG. 2, the power management unit 107 sets the drain potential VDL to VDD a little before the power management unit 107 sets the gate potential VGT to VDDH. Consequently, the transistor 101 is turned on and the detection potential VDTC is increased. Note that the drain potential VDL may be set to VDD after the gate potential VGT is set to VDDH.

At the time when the detection potential VDTC becomes substantially equal to the reference potential VREF, the output potential V3 of the comparator circuit 103 is set to VDD, so that the first power switch 104 and the second power switch 105 are turned off. Accordingly, the reference potential VREF is decreased to the potential VDS and becomes sufficiently lower than the detection potential VDTC; thus, the output potential V3 of the comparator circuit 103 is set to VDD stably.

Even after the output potential V3 of the comparator circuit 103 is set to VDD owing to signal delay, the power management unit 107 keeps operating normally for a while. A delay circuit may be provided between the power management unit 107 and the refresh timing determination unit 100 to further stabilize the operation.

After time passes, the detection potential VDTC is decreased and becomes substantially equal to the reference potential VREF at Time T6, so that the output potential V3 of the comparator circuit 103 is set to VSS. Consequently, the first power switch 104 and the second power switch 105 are turned on. Almost at the same time, the reference potential VREF is increased to VDD, and thus, the output potential V3 of the comparator circuit 103 is set to VSS stably. Consequently, power is supplied to the power management unit 107 and the circuit 108.

At Time T7, the control signal RC is transmitted from the power management unit 107 to the circuit 108. The circuit 108 which receives the control signal RC rewrites data (performs refresh operation) in the memory including a transistor using an oxide semiconductor. The control signal RC may be automatically transmitted when a certain time passes after power is supplied to the power management unit 107. In that case, the control signal RC may be transmitted similarly from Time T1 to Time T4, for example.

At Time T8, the control signal PWOFF is transmitted from the circuit 108 to the power management unit 107. After that, the power management unit 107 determines whether backup operation is necessary or not. The control signal BK is not transmitted because backup operation is determined to be unnecessary in this case. The power management unit 107 skips backup operation and proceeds to the next step.

At Time T9, in a manner similar to that at Time T5, the power management unit 107 sets the gate potential VGT to VDDH and sets the drain potential VDL to VDD. Accordingly, the transistor 101 is turned on and the detection potential VDTC is increased. At the time when the detection potential VDTC becomes substantially equal to the reference potential VREF, the output potential V3 of the comparator circuit 103 is set to VDD and the first power switch 104 and the second power switch 105 are turned off. Accordingly, the reference potential VREF is decreased to the potential VDS and becomes sufficiently lower than the detection potential VDTC; thus, the output potential V3 of the comparator circuit 103 is set to VDD stably.

By setting the reference potential VREF to be changed in accordance with the output potential V3 of the comparator circuit 103 as described above, the output potential V3 is more stable than that in the case where the reference potential VREF is fixed, and the circuit operates stably.

As apparent from the above description, the timing of refresh operation is automatically determined by the refresh timing determination unit 100, without measuring time using a timer or the like. Therefore, the clock of the semiconductor device can be stopped, so that the power consumption can be reduced. In the semiconductor device of the above example, even when the power supply to all circuits except the comparator circuit 103 is stopped, the timing at which refresh operation is needed can be obtained.

Although a counter including a plurality of registers is necessary in the case of using a timer or the like, such a circuit is not necessary in the present invention. Therefore, the occupied area can be reduced.

In particular, a semiconductor device (or an electronic appliance) used in a sensor network incorporates a battery because the proportion of non-operation time is extremely large and power supply is not convenient. In addition, for long-time operation, the power consumption is required to be as low as possible. The above semiconductor device is suitable for the purpose. Needless to say, any clock circuit may operate temporarily, periodically, or regularly.

The potential of the memory node in the memory cell largely depends on an environment temperature, and as the environment temperature is higher, retention characteristics deteriorate. A sensor network or the like is provided outside in most cases, and the environment temperature might drastically change between summer and winter. In such a case, refresh timing is required to be changed flexibly in accordance with the environment temperature, and the above operation method is suitable for the purpose.

MODIFICATION EXAMPLE 1

Figure 3:
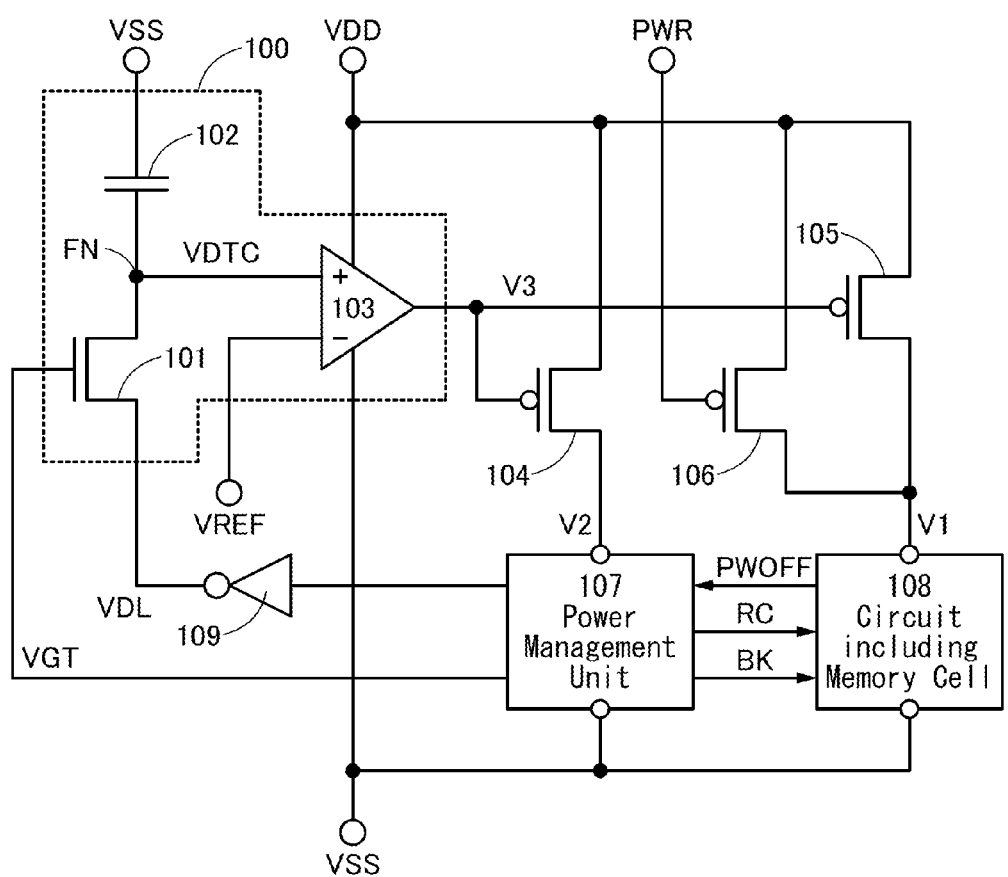
FIG. 3 is a circuit diagram illustrating an example of a semiconductor device.

A semiconductor device illustrated in FIG. 3 is a modification of the semiconductor device illustrated in FIG. 1. The semiconductor device illustrated in FIG. 3 is different from the semiconductor device in FIG. 1 in that, of potentials supplied from the power management unit 107, only a potential supplied to the drain of the transistor 101 is inverted by an inverter 109. Power is always supplied to the inverter 109 in a manner similar to that of the comparator circuit 103. In that case, a signal of the drain potential VDL is a signal obtained by inverting that in FIG. 2. For example, the drain potential VDL is VSS only in and around a period during which the transistor 101 is on, and the drain potential VDL is VDD in the other periods including a period during which power supply to the power management unit 107 is stopped.

This structure of potentials is required to determine accurate timing for refresh operation in the case where a memory cell in a circuit including a memory cell has a similar potential structure. The potential structure is effective because the data retention characteristics of the memory cell can be improved. The details will be described later.

MODIFICATION EXAMPLE 2

Figure 4:
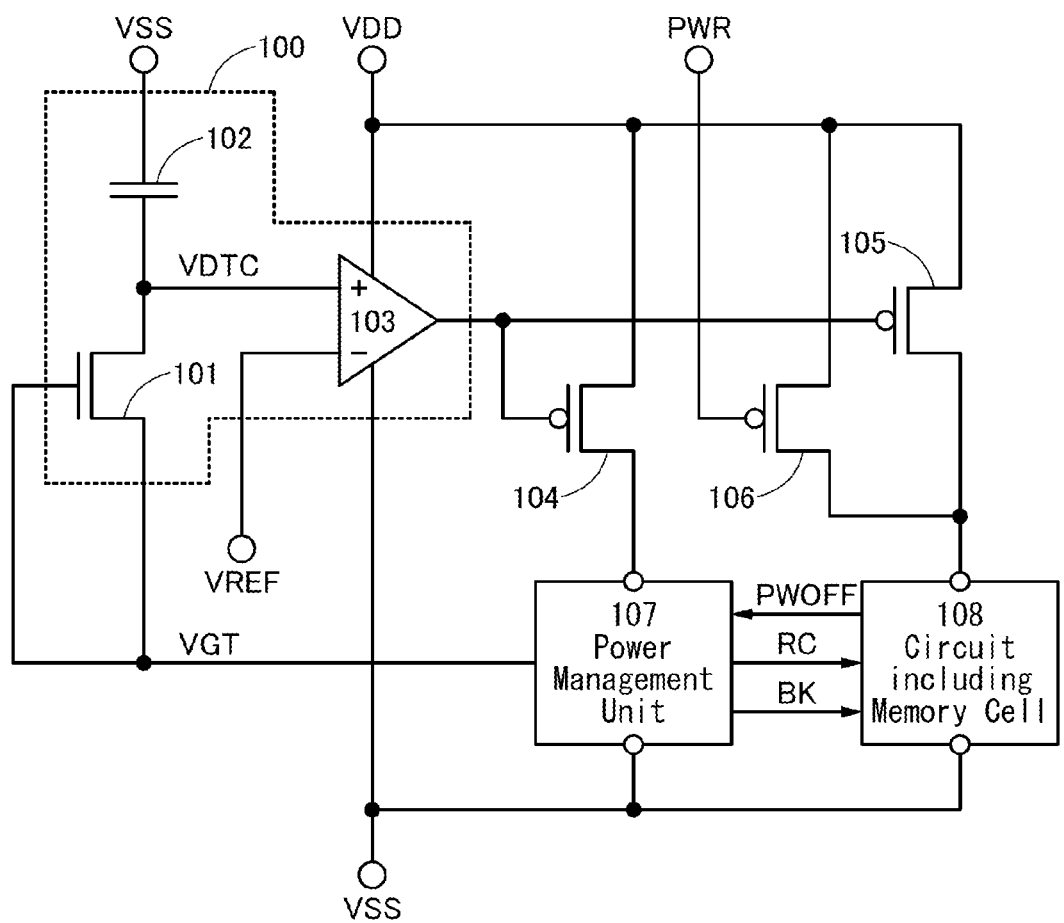
FIG. 4 is a circuit diagram illustrating an example of a semiconductor device.

A semiconductor device illustrated in FIG. 4 is a modification of the semiconductor device illustrated in FIG. 1. The semiconductor device illustrated in FIG. 4 is different from the semiconductor device illustrated in FIG. 1 in that the same potential is supplied to the gate and the drain electrode of the transistor 101. In other words, the power management unit 107 supplies the same potential as the gate potential VGT to the drain electrode of the transistor 101.

MODIFICATION EXAMPLE 3

Figure 5:
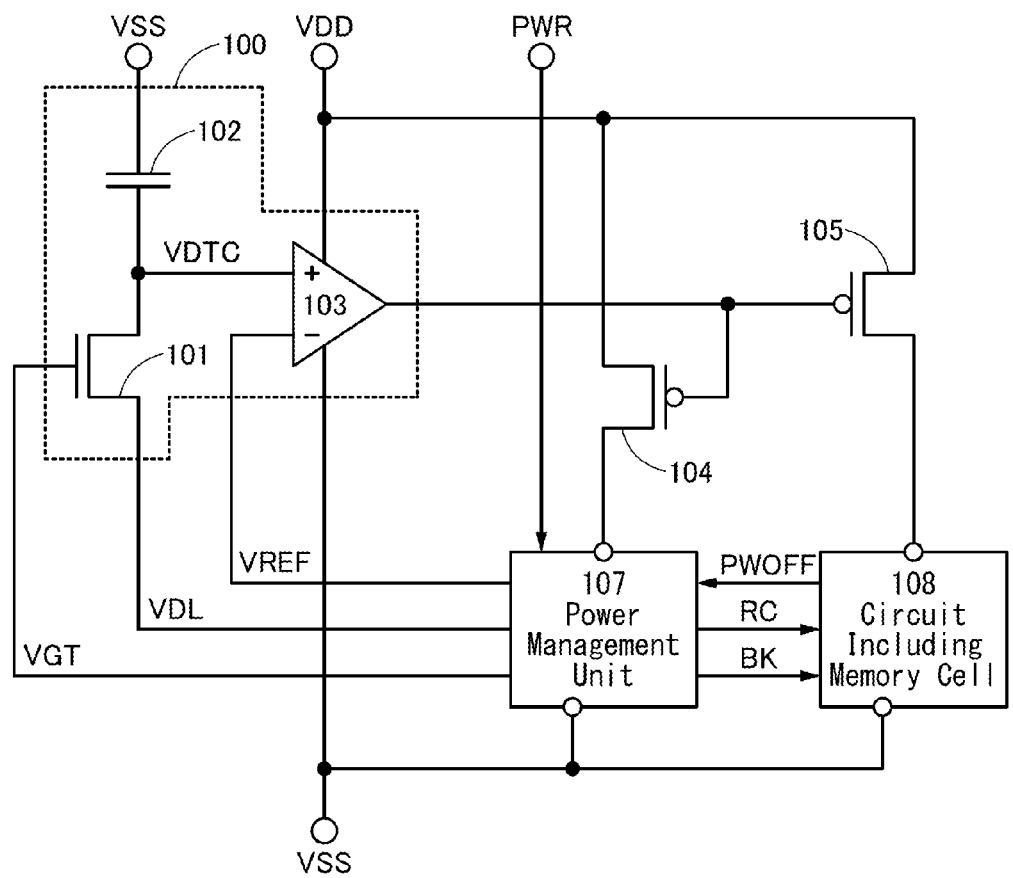
FIG. 5 is a circuit diagram illustrating an example of a semiconductor device.

A semiconductor device illustrated in FIG. 5 is a modification of the semiconductor device illustrated in FIG. 1. The semiconductor device illustrated in FIG. 5 is different from the semiconductor device illustrated in FIG. 1 in that the third power switch 106 is not provided, that the control signal PWR is input to the power management unit 107, and that the reference potential VREF is controlled by the power management unit 107.

When the control signal PWR is input to the power management unit 107, the power management unit 107 sets the reference potential VREF to VDD. Consequently, the output potential V3 of the comparator circuit 103 is set to VSS, so that the first power switch 104 and the second power switch 105 are turned on (power is supplied to the power management unit 107 and the circuit 108).

The reference potential VREF is changed owing to the state of the power supply to the power management unit 107 in addition to the control signal PWR. For example, when power is supplied to the power management unit 107, the reference potential VREF is set to VDD, and when power is not supplied to the power management unit 107, the reference potential VREF is set to VSS.

MODIFICATION EXAMPLE 4

Figure 6:
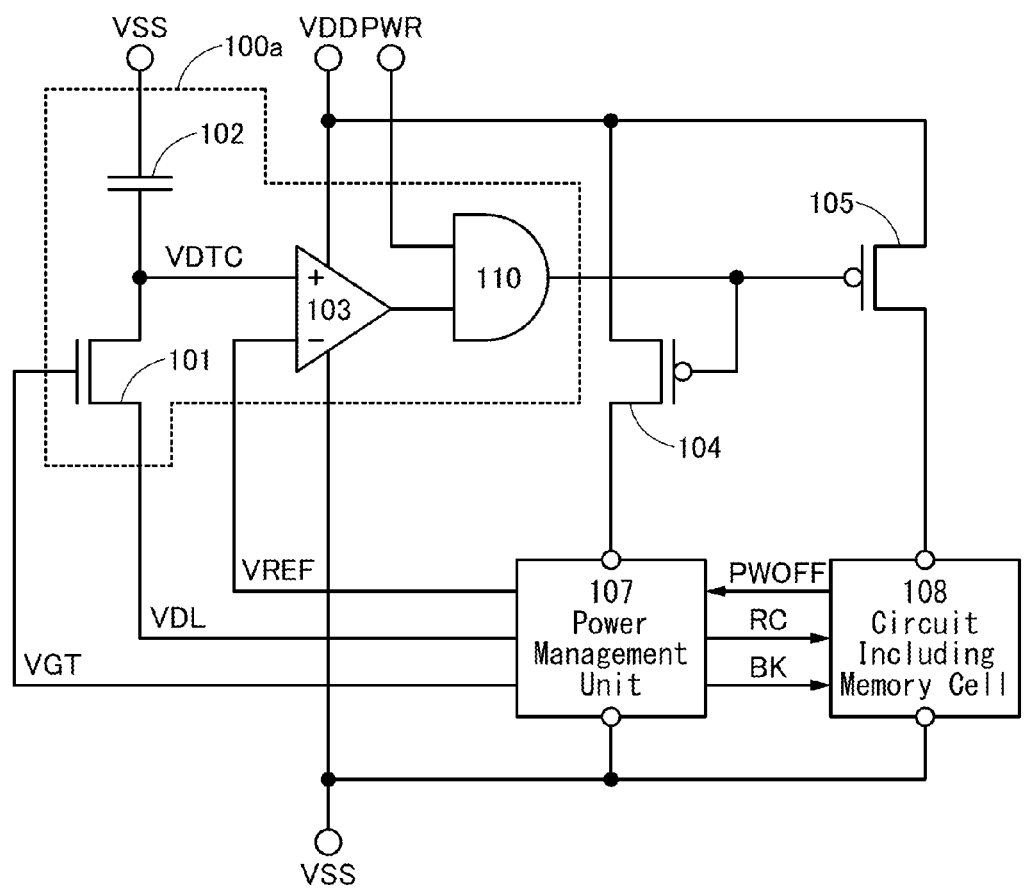
FIG. 6 is a circuit diagram illustrating an example of a semiconductor device.

A semiconductor device illustrated in FIG. 6 is a modification of the semiconductor device illustrated in FIG. 5. The semiconductor device illustrated in FIG. 6 is different from the semiconductor device illustrated in FIG. 5 in that the control signal PWR is input to a logic gate 110 provided in a refresh timing determination unit 100a, not to the power management unit 107. The output of the comparator circuit 103 is also input to the logic gate 110. Here, the logic gate 110 outputs VDD only when both of two inputs are VDD, and the logic gate 110 outputs VSS when at least one of them is VSS.

When the control signal PWR becomes VSS, the logic gate 110 outputs VSS, so that the first power switch 104 and the second power switch 105 are turned on (power is supplied to the power management unit 107 and the circuit 108). Even when the detection potential VDTC is decreased and becomes lower than the reference potential VREF and thus the comparator circuit 103 outputs VSS, the logic gate 110 outputs VSS, so that the first power switch 104 and the second power switch 105 are turned on.

Examples of the logic gate include, in addition to ones defined above, one which outputs VSS only when two inputs are different (that is, when one of them is VSS) and which outputs VDD when both of the two inputs are VDD or VSS.

In the above case, when the output of the comparator circuit 103 is VSS and the potential of the control signal PWR is set to VSS, the logic gate 110 outputs VDD. In order to avoid this problem, any signal is preferably set to be transmitted when power is supplied to the power management unit 107 or the circuit 108, and the control signal PWR preferably reflects the signal and is transmitted.

In the above example, since the detection potential VDTC has already been decreased, the output potential of the comparator circuit 103 is VSS; thus, power is supplied to the power management unit 107 and the circuit 108. Therefore, when a signal transmitted from either of the power management unit 107 and the circuit 108 is detected, the control signal PWR is not transmitted. In the case where power is supplied to the power management unit 107 and the circuit 108 owing to the decrease in the detection potential VDTC, the power supply time is sufficiently short because the power supply is performed for the purpose of performing refresh operation on the memory including a transistor using an oxide semiconductor in the circuit 108.

MODIFICATION EXAMPLE 5

In the refresh timing determination unit 100 illustrated in FIG. 1, large parasitic capacitance of a wiring between the source electrode of the transistor 101 and the comparator circuit 103 becomes a problem in some cases. An example in which the problem is solved is described.

Figure 7A:
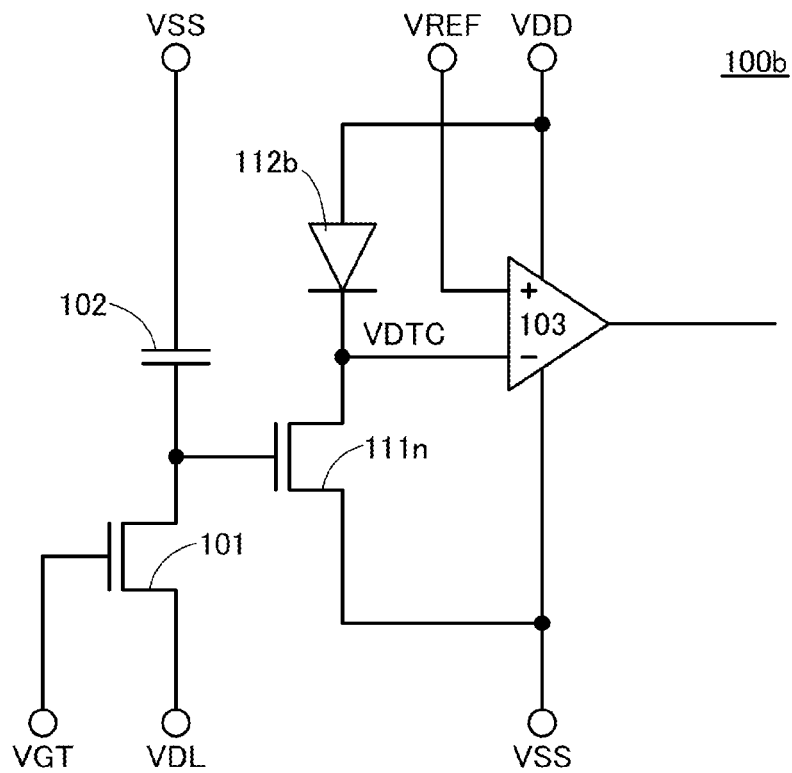
FIGS. 7A and 7B are circuit diagrams each illustrating an example of a semiconductor device.

A refresh timing determination unit 100b illustrated in FIG. 7A is the refresh timing determination unit 100 illustrated in FIG. 1 or the like in which an n-channel transistor 111n and a diode 112b are further provided, the source electrode of the transistor 101 is connected to a gate of the transistor 111n, a drain electrode of the transistor 111n is connected to a negative electrode of the diode 112b, a source electrode of the transistor 111n is supplied with VSS, and a positive electrode of the diode 112b is supplied with VDD. The reference potential VREF and the potential (detection potential VDTC) of the negative electrode of the diode 112b are input to the comparator circuit 103.

An oxide semiconductor is not necessarily used for the transistor 111n. As the diode 112b, an n- or p-channel transistor may be used. Instead of the diode 112b, a resistor may be used.

Parasitic capacitance of the source electrode of the transistor 101 is gate capacitance of the transistor 111n and the like and can be set to be substantially equal or lower than or equal to the input capacitance of the comparator circuit 103 of the refresh timing determination unit 100 in FIG. 1. The distance of a wiring between the source electrode of the transistor 101 and the gate electrode of the transistor 111n can be sufficiently short, and thus, the parasitic capacitance of the wiring can also be sufficiently reduced.

The potential of the gate of the transistor 111n is initially VDD, and thus, the transistor 111n is on. Therefore, the detection potential VDTC is almost VSS. Since the detection potential VDTC is lower than the reference potential VREF, the output potential of the comparator circuit 103 is set to VDD.

The drain potential VDL remains VSS, and as a result, the potential of the gate of the transistor 111n is gradually decreased. Thus, the resistance between the source electrode and the drain electrode of the transistor 111n is increased, and the detection potential VDTC is gradually increased. Consequently, when the detection potential VDTC is higher than a certain value, the output potential of the comparator circuit 103 becomes VSS.

As described above, "the change of the output potential of the comparator circuit 103 from VDD to VSS in accordance with a decrease in the potential of the source electrode of the transistor 101 (potential of the gate of the transistor 111n)" also occurs in the refresh timing determination unit 100 of the semiconductor device in FIG. 1; thus, the refresh timing determination unit 100 in FIG. 1 can be replaced by the refresh timing determination unit 100b.

MODIFICATION EXAMPLE 6

Taking the accuracy of the comparator circuit 103 into consideration, in the refresh timing determination unit 100b, when the detection potential VDTC is substantially equal to the reference potential VREF, the forward resistance of the diode 112b is required to be lower than or equal to $1/10$ of the resistance of the transistor 111n. The transistor 111n is almost in an on state, and the resistance of the diode 112b is not so large; thus, relatively large current always flows between the transistor 111n and the diode 112b, so that the power consumption becomes large.

Figure 7B:
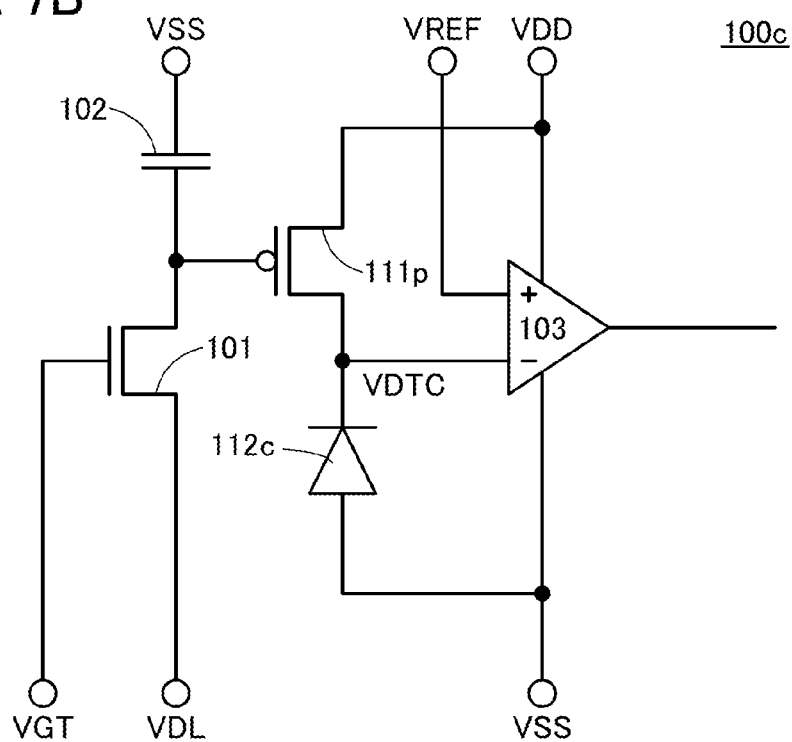

A refresh timing determination unit 100c illustrated in FIG. 7B solves the above problem. In the refresh timing determination unit 100c, a p-channel transistor 111p is used, a drain electrode of the transistor 111p is connected to a negative electrode of a diode 112c, VDD is supplied to a source electrode of the transistor 111p, and VSS is supplied to a positive electrode of the diode 112c. The transistor 111p does not necessarily include an oxide semiconductor.

The potential of the gate of the transistor 111p is initially VDD, and thus, the transistor 111p is off. At this time, the diode 112c is designed so that its reverse resistance is lower than or equal to 1/10 of the resistance of the transistor 111p. Therefore, the detection potential VDTC is almost VSS. Since the detection potential VDTC is lower than the reference potential VREF, the output potential of the comparator circuit 103 is set to VDD. Since the transistor 111p is off, current flowing between the transistor 111p and the diode 112c in this state is sufficiently small.

After that, the potential of the gate of the transistor 111p is gradually decreased. Thus, the resistance between the source electrode and the drain electrode of the transistor 111p is decreased, and the detection potential VDTC is gradually increased. Consequently, when the detection potential VDTC is higher than a certain value, the output potential of the comparator circuit 103 becomes VSS. At this time, current flowing between the transistor 111p and the diode 112c is almost determined by the reverse resistance of the diode 112c. The reverse resistance of the diode 112c is much higher than the forward resistance of the diode 112b of the refresh timing determination unit 100b; thus, current flowing between the transistor 111p and the diode 112c is much smaller than that in the case of the refresh timing determination unit 100b. Accordingly, the power consumption can be reduced.

MODIFICATION EXAMPLE 7

Figure 8A:
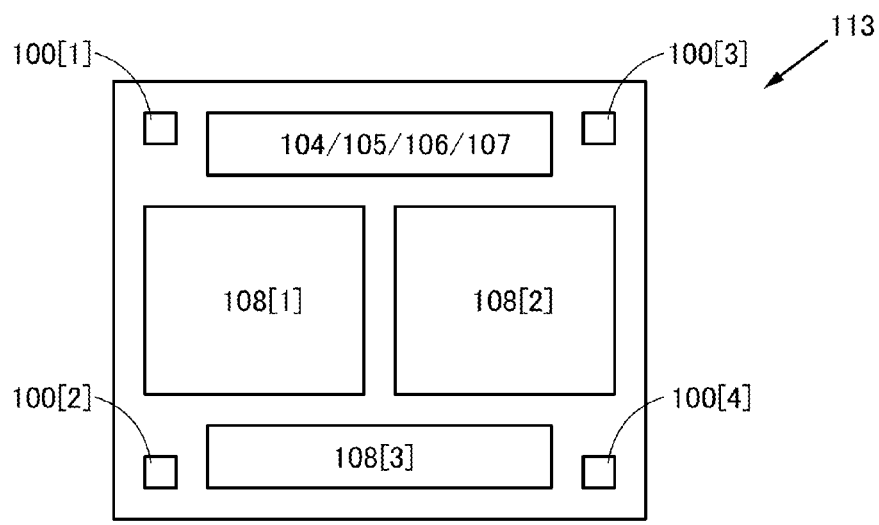
FIGS. 8A and 8B are block diagrams illustrating an example of a semiconductor device.

Refresh timing can be detected by providing a plurality of refresh timing determination units 100 illustrated in FIG. 1 in a chip (semiconductor device) and using OR, AND, or the like thereof. FIG. 8A illustrates a chip 113 including four refresh timing determination units 100[1] to 100[4]. The four refresh timing determination units 100[1] to 100[4] are provided on four corners of the chip 113.

The chip 113 further includes the first power switch 104 to the third power switch 106, the power management unit 107, and circuits 108[1] to 108[3] each including memory cells. The circuit 108[1] and the circuit 108[2] are core processors each incorporating a cache memory, and the circuit 108[3] is a cache memory which can be used by the circuit 108[1] and the circuit 108[2].

Figure 8B:
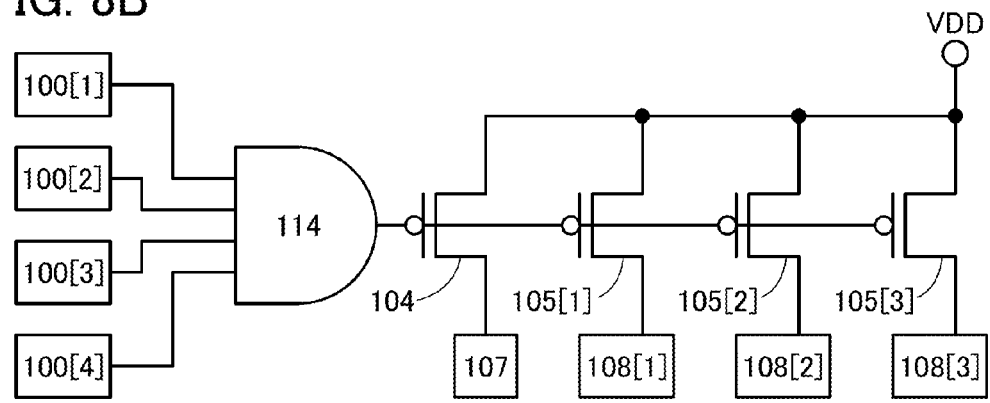

FIG. 8B illustrates outline of signal transmission and power supply of the four refresh timing determination units 100[1] to 100[4], the first power switch 104, second power switches 105[1] to 105[3], the power management unit 107, and the circuits 108[1] to 108[3].

Outputs of the refresh timing determination units 100[1] to 100[4] are input to the logic gate 114. Here, the logic gate 114 outputs VDD only in the case where all of four inputs are VDD and outputs VSS in the other cases, for example.

The output of the logic gate 114 is input to the first power switch 104 and the second power switches 105[1] to 105[3], and when the output of the logic gate 114 is VSS (i.e., in the case where the detection potential VDTC is decreased in any of the refresh timing determination units 100[1] to 100[4]), power is supplied to the power management unit 107 and the circuits 108[1] to 108[3], and refresh operation is performed.

EXAMPLE 1 OF MEMORY CELL

Figure 9:
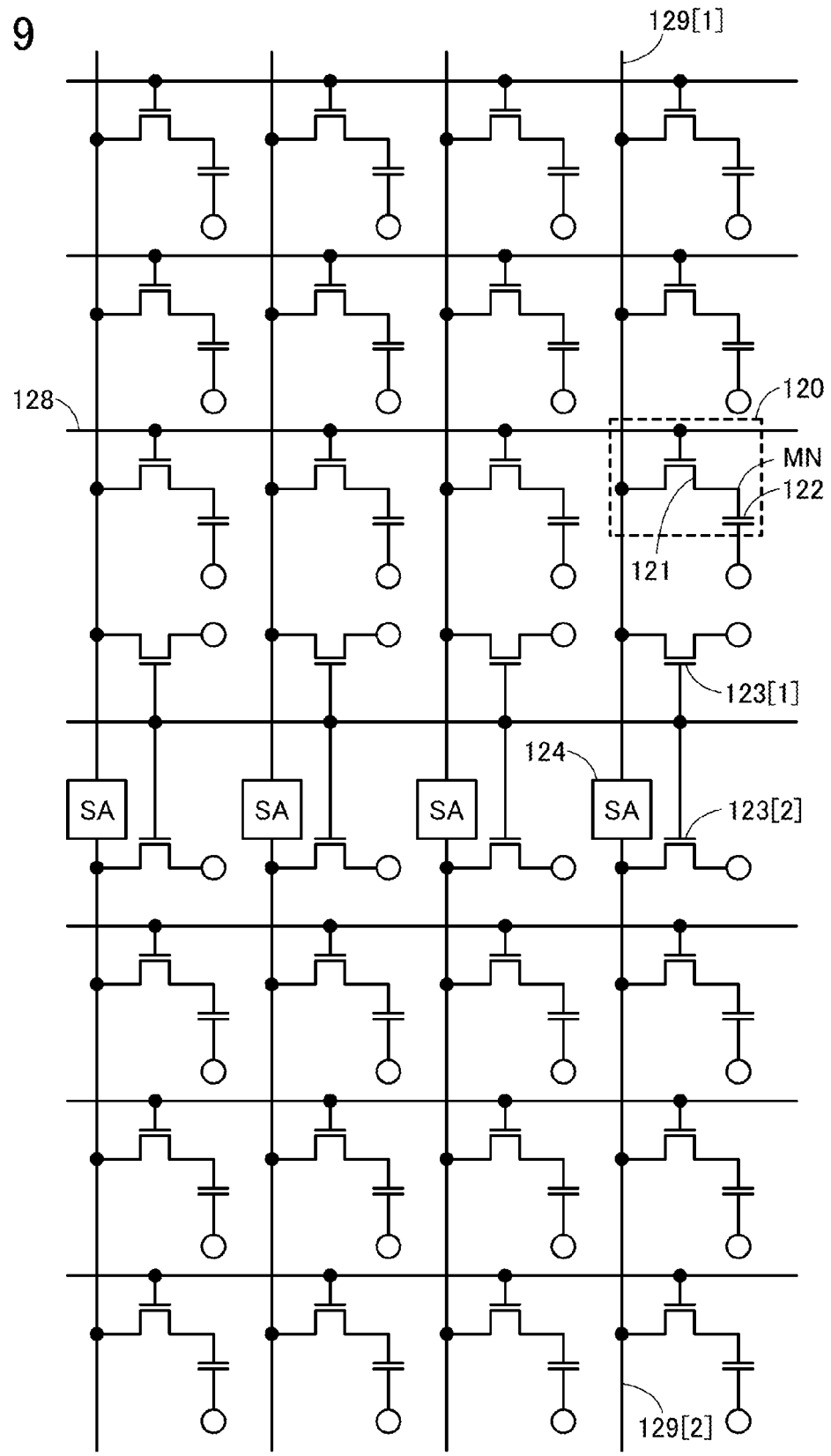
FIG. 9 is a circuit diagram illustrating an example of a memory cell array.

Memory cells used in the circuit 108 are described with reference to FIG. 9. FIG. 9 illustrates a memory cell array in which memory cells 120 are arranged in a matrix. The memory cell 120 is a 1T1C type memory cell including a cell transistor 121 and a capacitor 122. The cell transistor 121 uses an oxide semiconductor and has a high off-state resistance. The memory cell 120 is driven by a word line 128 and a bit line 129.

The memory cell array illustrated in FIG. 9 has an open-bit-line structure. In other words, a pair of bit lines (bit lines 129[1] and 129[2]) are provided symmetrically to sandwich the sense amplifier 124.

Refresh operation is described here. The refresh operation is operation in which data stored in the memory cell 120 is taken out, amplified, and then written to the memory cell 120. The potential of a memory node MN (a connection portion between one of a source and a drain of the cell transistor 121 and one electrode of the capacitor 122, and hereinafter, "memory node" refers to a structure portion similar to the memory node MN) in the memory cell might be different from an initial potential immediately before refresh operation is performed. Specifically, in general, even when the potential of the memory node MN is VDD immediately after data writing, the potential of the memory node MN is lower than VDD immediately before refresh operation.

First, data stored in the memory cell 120 is taken out. In advance, the potentials of the bit lines 129[1] and 129[2] are set to a certain potential. For example, the potentials are generally set to an average value of VDD and VSS. Specifically, by turning on a precharge transistor 123[1] and a precharge transistor 123[2], the potentials of the bit lines 129[1] and 129[2] are set to a predetermined potential.

Next, the potential of the word line 128 is controlled so that the cell transistor 121 is turned on. Accordingly, charges are moved between the capacitor 122 and the bit line 129[1], and the potential of the bit line 129[1] is changed. The change in the potential is determined by the capacitance of the bit line 129[1] (including parasitic capacitance) and the capacitance of the capacitor 122. In contrast, in the bit line 129[2], charges are not moved between the bit line 129[2] and a memory cell connected thereto, and the potential is not changed. In other words, a slight difference in potentials is generated between the bit line 129[1] and the bit line 129[2].

For example, in the case where the potential of the memory node in the memory cell 120 shown by a dotted line in the drawing is VDD immediately after data writing, the potential of the bit line 129[1] is slightly higher than the potential of the bit line 129[2]. In contrast, in the case where the potential of the memory node is VSS immediately after data writing, the potential of the bit line 129[1] is slightly lower than the potential of the bit line 129[2].

The potential difference is amplified by the sense amplifier 124. In the case where the potential of the bit line 129[1] is slightly higher than that of the bit line 129[2] (the case where the potential of the memory node is VDD immediately after data writing), the potential of the bit line 129[1] and the potential of the bit line 129[2] are set to VDD and VSS, respectively, by the sense amplifier 124. Since the cell transistor 121 is on at this time, the potential of the memory node becomes VDD. That is, the potential returns to the initial state.

By performing the above operation on all of pairs of bit lines at the same time, refresh operation for one row of a memory cell array (a memory cell group controlled by one word line) is finished. By performing the same operation on the other rows, refresh operation for the whole memory cell array is finished.

EXAMPLE 2 OF MEMORY CELL

Figure 10A:
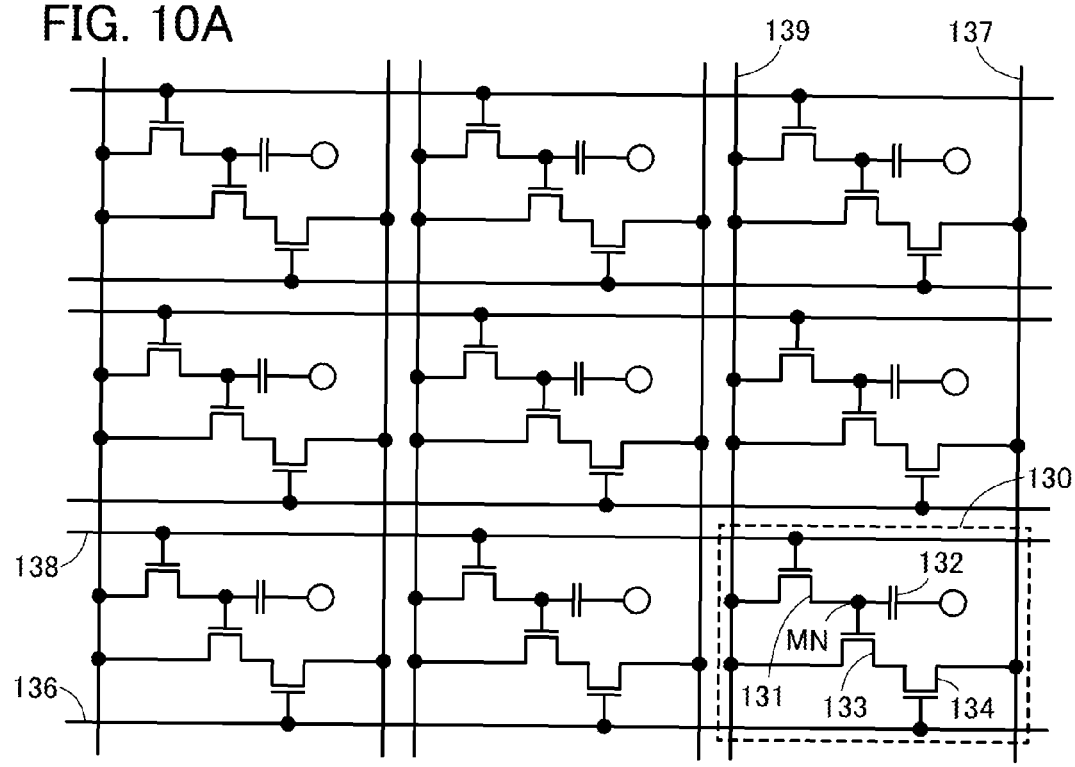
FIGS. 10A and 10B are circuit diagrams each illustrating an example of a memory cell array.

The memory cells used in the circuit 108 are described with reference to FIG. 10A. FIG. 10A illustrates a memory cell array in which memory cells 130 are arranged in a matrix. The memory cell 130 is a 3T1C type memory cell including a writing transistor 131, a capacitor 132, a reading transistor 133, and a selection transistor 134. The writing transistor 131 uses an oxide semiconductor and has a high off-state resistance. The memory cell 130 is driven by a read word line 136, a wiring 137, a write word line 138, and a bit line 139.

In the case of using the memory cell 130 having such a structure, in a driving method, data opposite to written data appears in the wiring 137 at the time of data reading. For example, in the case where the potential of the bit line 139 is VDD at the time of writing (the potential of the memory node MN is VDD), the potential of the wiring 137 becomes VSS at the time of reading. In order to perform refresh operation, the potential of the wiring 137 is inverted and transmitted to the bit line 139 and the writing transistor 131 in the memory cell from which data is read is turned on, so that the potential of the memory node MN can be set to VDD.

In another driving method, at the time of data reading, the potential of the bit line 139 is used without referring to the potential of the wiring 137. In that case, the potential of the bit line 139 at the time of data reading is compared with an appropriate potential and amplified. For example, in the case where the potential of the bit line 139 is VDD at the time of data writing (the potential of the memory node MN is VDD), the potential of the bit line 139 becomes lower than VDD at the time of reading. The potential of the bit line 139 at the time of data reading is compared with the appropriate potential and amplified so that the potential of the bit line 139 is set to VDD. Data reading operation is thus finished. Refresh operation may be performed in such a manner that the writing transistor 131 in the memory cell from which data is read is turned on so that the potential of the memory node MN is set to VDD.

In the memory cell 130, two or more bits of data (multilevel data) can be retained in one memory cell. Refresh operation in that case is performed in the following manner: stored data is taken out once and determined, the potential of the bit line 139 is set to a potential corresponding to the data, the writing transistor 131 in the memory cell from which data is read is turned on, and then the potential of the memory node MN is set to a potential corresponding to the stored data.

Figure 10B:
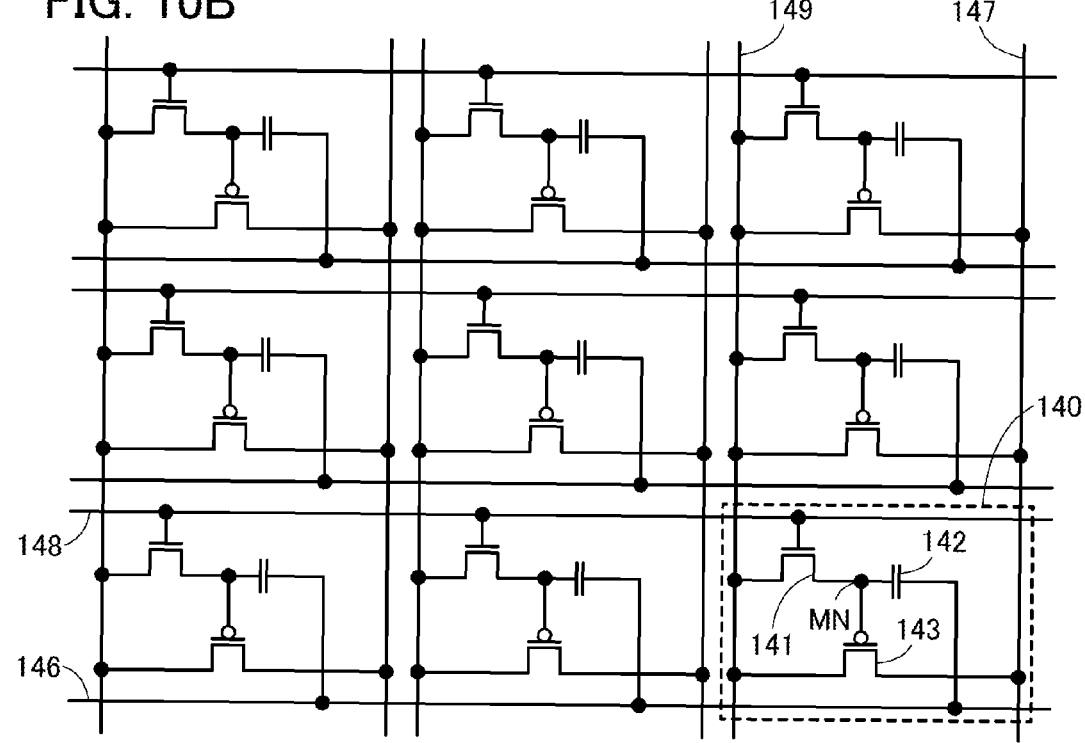

A memory cell 140 illustrated in FIG. 10B is a modification of the memory cell 130. The memory cell 140 includes a writing transistor 141, a capacitor 142, and a reading transistor 143 which are controlled by a read word line 146, a wiring 147, a write word line 148, and a bit line 149.

In the memory cell 140, at the time of reading, a memory cell to be read is selected by capacitive coupling through the capacitor 142 instead of selecting a memory cell with the selection transistor 134. In other words, by changing the potential of the read word line 146, the potential of the memory node MN is changed. Consequently, regardless of stored data, the reading transistor 143 can be turned off. The memory cell to be read can be selected by setting the potential of the read word line 146 in accordance with the stored data so that the reading transistor 143 is turned on/off.

EXAMPLE 3 OF MEMORY CELL

Figure 11:
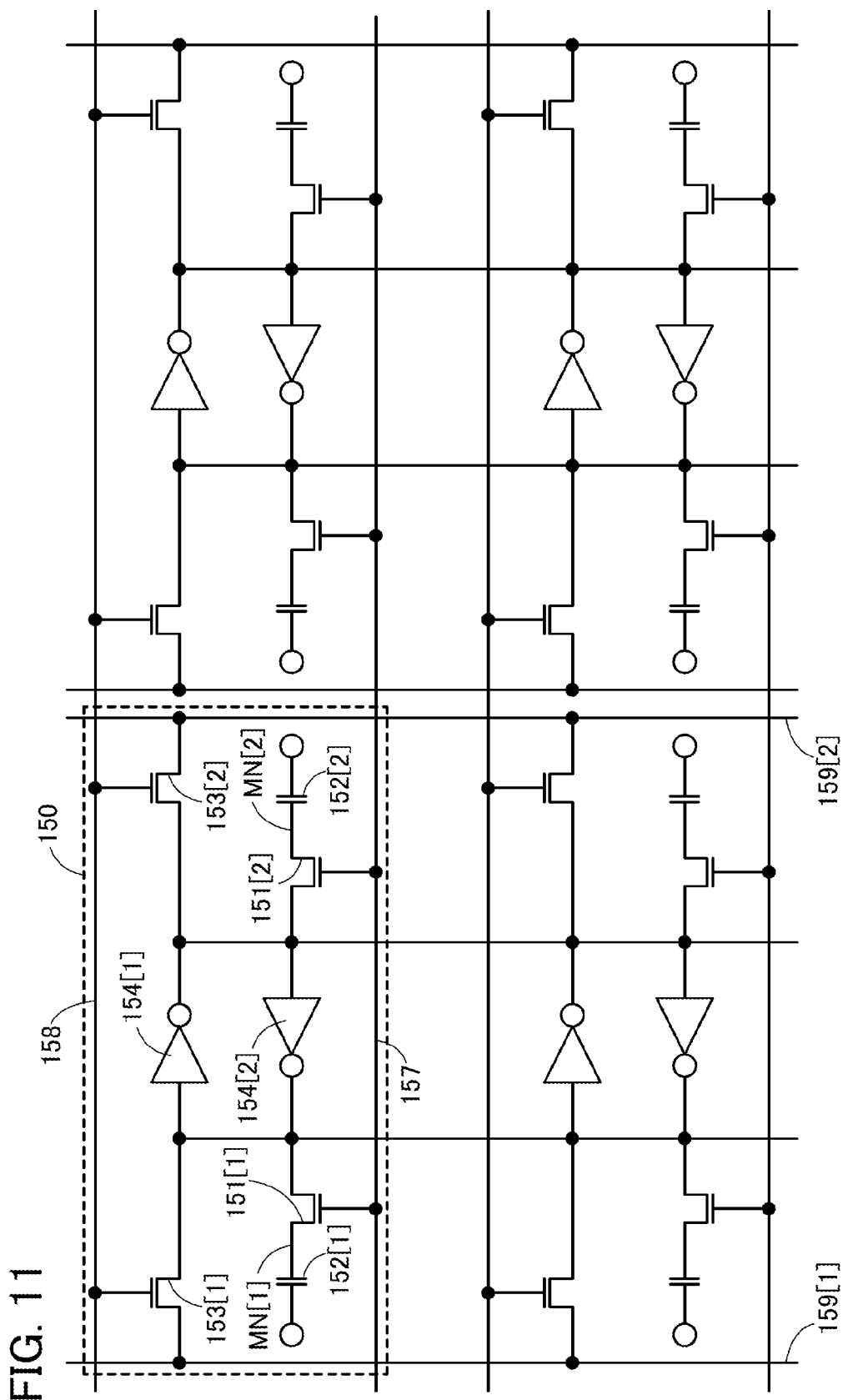
FIG. 11 is a circuit diagram illustrating an example of a memory cell array.

The memory cells used in the circuit 108 are described with reference to FIG. 11. FIG. 11 illustrates an example of a memory cell array including a composite memory cell. The memory cell 150 includes cell transistors 151[1] and 151[2], capacitors 152[1] and 152[2], selection transistors 153[1] and 153[2], and inverters 154[1] and 154[2]. The selection transistors 153[1] and 153[2] and the inverters 154[1] and 154[2] have the same structure as a so-called SRAM and are controlled by a word line 158, a bit line 159[1], and a bit line 159[2]. Hereinafter, this portion is referred to as an SRAM portion.

Although a circuit including the cell transistor 151[1] and the capacitor 152[1] (or the cell transistor 151[2] and the capacitor 152[2]) is similar to a circuit in the memory cell 120 illustrated in FIG. 9, in the memory cell 150, the on/off state of the cell transistor 151[1] (or the cell transistor 151[2]) is controlled by a backup word line 157 and an output potential of the inverter 154 [1] (or the inverter 154[2]) is supplied to the memory node MN[1] (or the memory node MN[2]) through the cell transistor 151[1] (or the cell transistor 151[2]). Hereinafter, a structure including the cell transistor 151[1] and the capacitor 152[1] (or the cell transistor 151[2] and the capacitor 152[2]) is referred to as a backup memory cell. For example, a piece of data is retained by a pair of two backup memory cells.

An operation example of the memory cell 150 will be described. The memory cell 150 is usually used as an SRAM, and data retained in the SRAM portion can be read at high speed. In the memory cell, to reduce the power consumption in a standby mode, power supply to the inverters 154[1] and 154[2] is stopped. Data retained in the SRAM portion is transferred to a backup memory cell before the power supply is stopped because the data retained in the SRAM portion is lost. Such operation is referred to as backup operation.

The backup operation is performed in the following manner, for example: in a state where the selection transistors 153[1] and 153[2] are off, the cell transistors 151[1] and 151[2] are turned on. Consequently, the potential of the memory node MN[1] becomes substantially equal to the output potential of the inverter 154[2] and the potential of the memory node MN[2] becomes substantially equal to the output potential of the inverter 154[1].

Then, by turning off the selection transistor 153, the potential of the memory node in each backup memory cell is retained for a long time. Power supply to the inverters 154[1] and 154[2] is also stopped. At this time, the output potentials and the input potentials of the inverters 154[1] and 154[2] are VDD. This can be achieved by providing and turning off a power switch on the VSS side of each of the inverters 154[1] and 154[2], for example. The potential of the backup word line 157 is set to VSS.

In this state, retention characteristics of the potentials of the memory nodes MN[1] and MN[2] are improved. For example, when the potential of the memory node MN[1] is VDD, the potential is not changed from VDD even when time passes after the power supply is stopped.

Although the off-state resistance of the cell transistor 151[2] is extremely high, when the potential of the memory node MN[2] is VSS, the potential is certainly increased from VSS as time passes. However, when the potential of the memory node MN[2] is increased, the potential (VSS) of a gate of the cell transistor 151[2] becomes lower than the potentials of a source (the memory node MN[2]) and a drain (an output terminal of the inverter 154[1]); thus, the off-state resistance becomes high. Therefore, although the potential of the memory node MN[2] is increased from VSS, the increase rate becomes lower as the potential is increased (the above phenomenon is referred to as an effect of a gate electrode which is practically negatively biased).

The above case is different from the case where the output potentials and the input potentials of the inverters 154[1] and 154[2] are set to VSS and the potential of the backup word line 157 is set to VSS. In the above case, when the potential of the memory node MN[2] is set to VSS, the potential is not changed from VSS even when time passes after the power supply is stopped. This is similar to the above case of the memory node MN[1].

Although the off-state resistance of the cell transistor 151[2] is extremely high, when the potential of the memory node MN[1] is VDD, the potential is decreased from VDD as time passes. In addition, since the potential (VSS) of the gate of the cell transistor 151[2] is equal to the potential (VSS) of the source (an output terminal of the inverter 154[2]), the potential of the drain (the memory node MN[1]) is decreased from the initial potential (VDD) at a substantially constant rate (precisely, although the decrease rate of the potential is lowered when the potential of the memory node MN[1] is decreased, a similar effect is generated in the above case (the effect of the gate electrode which is practically negatively biased) and the decrease rate of the potential is much lower than that in the above case overall).

Such an effect is also generated in the memory cell 120 illustrated in FIG. 9, the memory cell 130 illustrated in FIG. 10A, and the memory cell 140 illustrated in FIG. 10B. Since the off-state resistance of the transistor is changed depending on a relation among the potentials of the source, the drain, and the gate of the transistor as described above, when the potentials of the gate and the drain of the transistor 101 in the refresh timing determination unit are potentials similar to those in a practical memory cell, timing of refresh operation can be accurately determined.

Next, loading of data from the backup memory cell to the SRAM portion is described. Loading of data is performed, for example, by turning on the cell transistor 151 in a state where the selection transistor 153 is off. Although power may be supplied to the inverter 154 in advance, power may be supplied to the inverter 154 immediately after the loading. Alternatively, in a state where power is supplied to only one of the inverters 154 and is not supplied to the other of the inverters 154, power may be supplied to the other of the inverters 154 immediately after the loading.

For example, immediately before the cell transistor 151 is turned on, the potential of the memory node in the backup memory cell including the cell transistor 151[1] and the capacitor 152[1] is VDD and the potential of the memory node in the backup memory cell including the cell transistor 151[2] and the capacitor 152[2] is slightly higher than VSS.

In the case where the cell transistor 151 is turned on in a state where power is not supplied to the inverter 154, the input potential of the inverter 154[1] is affected by the potential of the memory node in the backup memory cell including the cell transistor 151 [2] and the capacitor 152[2] and the input potential of the inverter 154[2] is affected by the potential of the memory node in the backup memory cell including the cell transistor 151[1] and the capacitor 152[1].

When each of the potentials of the memory nodes in the backup memory cells is the above potential, although the input potential of the inverter 154[1] is not significantly changed from VDD, the input potential of the inverter 154[2] is drastically decreased from VDD. By supplying power to the inverters, the inverters 154 output potentials corresponding to their respective inputs, so that the output potential of the inverter 154[1] and the output potential of the inverter 154[2] are set to VSS and VDD, respectively, which is stable. In such a manner, data is loaded from the backup memory cell to the SRAM portion.

Since the cell transistor 151[1] and the cell transistor 151[2] are on at this time, the potentials of the memory nodes in the two backup memory cells are VDD or VSS and correspond to their respective potentials before the loading. In other words, the potential of the memory node MN[1] in the backup memory cell including the cell transistor 151[1] and the capacitor 152[1] is VDD before and after the loading, whereas the potential of the memory node MN[2] in the backup memory cell including the cell transistor 151[2] and the capacitor 152[2] is slightly higher than VSS before the loading and becomes VSS after the loading. That is, refresh operation is performed at the same time as the loading.

After the loading, the potential of the backup word line 157 is set to VSS, so that the cell transistor 151[1] and the cell transistor 151[2] are turned off. Then, power supply to the inverters 154[1] and 154[2] is also stopped in refresh operation.

EXAMPLE 1 OF TRANSISTOR USING OXIDE

Figure 12A:
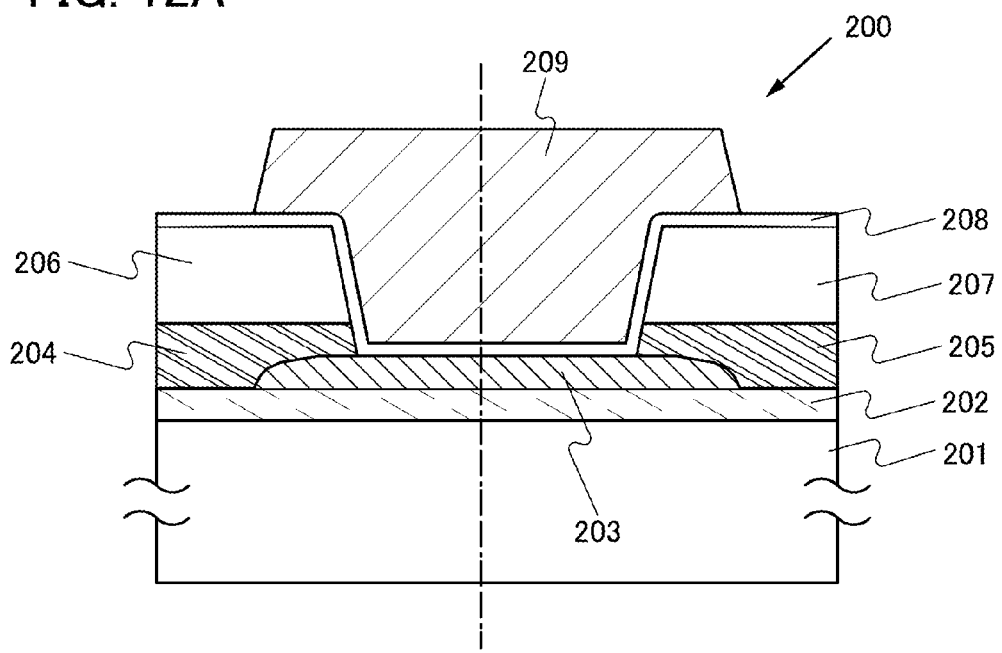
FIGS. 12A and 12B are schematic cross-sectional views illustrating an example of a transistor.
Figure 12B:
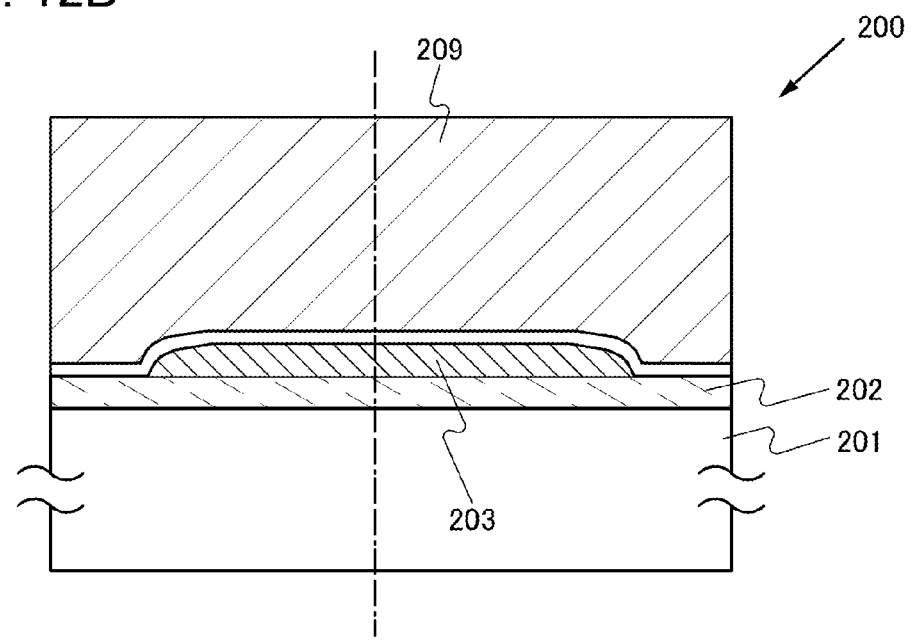

FIGS. 12A and 12B illustrate an example of a structure of a transistor which can be used as the transistor 101 and the transistor using an oxide semiconductor included in the circuit 108.

FIGS. 12A and 12B illustrate an example of a coplanar transistor. FIG. 12A illustrates an example of a cross section taken along dashed-dotted line in FIG. 12B. FIG. 12B illustrates an example of a cross section taken along dashed-dotted line in FIG. 12A.

A transistor 200 illustrated in FIG. 12A includes a base insulating film 202 over an insulating layer 201, an oxide semiconductor 203 over the base insulating film 202, a source electrode 204 in contact with a part of the oxide semiconductor 203, a drain electrode 205 in contact with another part of the oxide semiconductor 203, a spacer insulator 206 which is in contact with the source electrode 204 and has substantially the same planar shape as the source electrode 204, a spacer insulator 207 having substantially the same planar shape as the drain electrode 205, a gate insulating film 208 covering the oxide semiconductor 203, the spacer insulator 206, and the spacer insulator 207, and a gate electrode 209 overlapping with the oxide semiconductor 203 with the gate insulating film 208 provided therebetween.

A silicon wafer is provided under the insulating layer 201. A transistor including a channel in the silicon wafer and a circuit accompanying the transistor are provided.

The oxide semiconductor 203 is a film with a thickness of greater than or equal to 5 nm and less than or equal to 40 nm. For example, the thickness is greater than or equal to 10 nm and less than or equal to 15 nm. In particular, in the case of a transistor whose channel length is less than or equal to 30 nm, when the thickness of the oxide semiconductor 203 is set to approximately 5 nm, a short-channel effect can be suppressed and the transistor can have stable electrical characteristics.

The oxide semiconductor preferably contains at least indium (In) or zinc (Zn). In particular, In and Zn are preferably contained. As a stabilizer for reducing variations in electrical characteristics of a transistor using the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, the following can be used: indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main components and there is no particular limitation on the ratio of In, Ga, and Zn. The In—Ga—Zn-based oxide may contain another metal element in addition to In, Ga, and Zn.

As the oxide semiconductor, a material which has a band gap of 2.5 eV or more, e.g., a band gap of 3.0 eV or more, is selected in order to reduce the off-state current of the transistor. Instead of the oxide semiconductor, a material having semiconductor characteristics and a band gap in the above-described range (e.g., silicon carbide or gallium nitride) may also be used.

By using the oxide semiconductor 203 described above, the off-state current of the transistor 200 can be reduced. In particular, the off-state current of the transistor can be less than or equal to $1 \times 10^{-18}$ A, less than or equal to $1 \times 10^{-21}$ A, or less than or equal to $1 \times 10^{-24}$ A. Therefore, the memory cell which has excellent data retention characteristics and low power consumption can be manufactured. For the details, refer to Patent Documents 1 to 3.

EXAMPLE 2 OF TRANSISTOR USING OXIDE

Figure 13A:
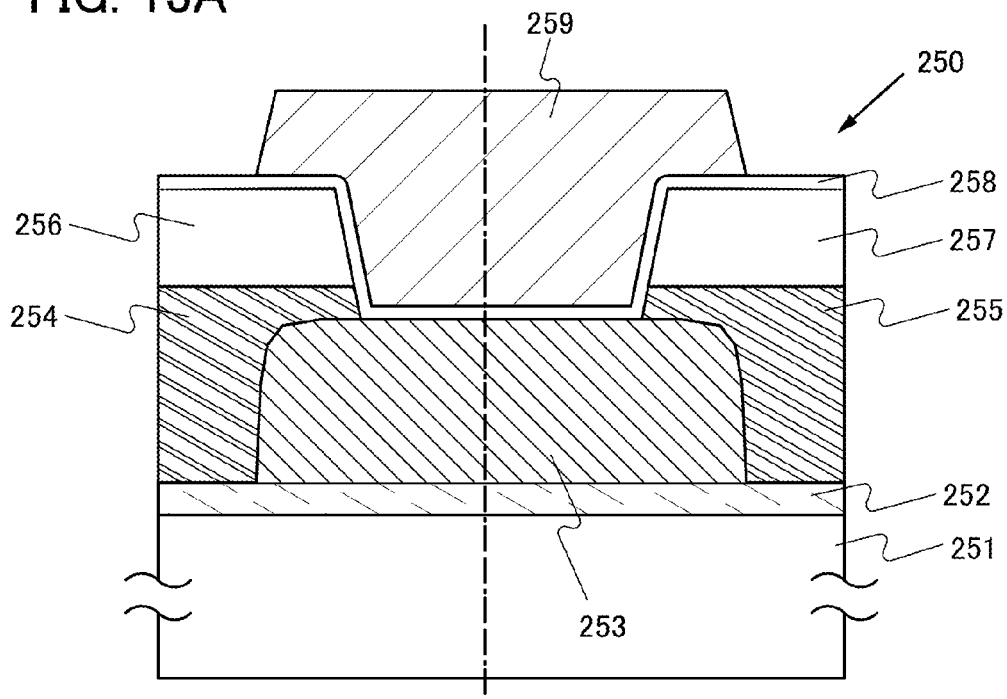
FIGS. 13A and 13B are schematic cross-sectional views illustrating an example of a transistor.
Figure 13B:
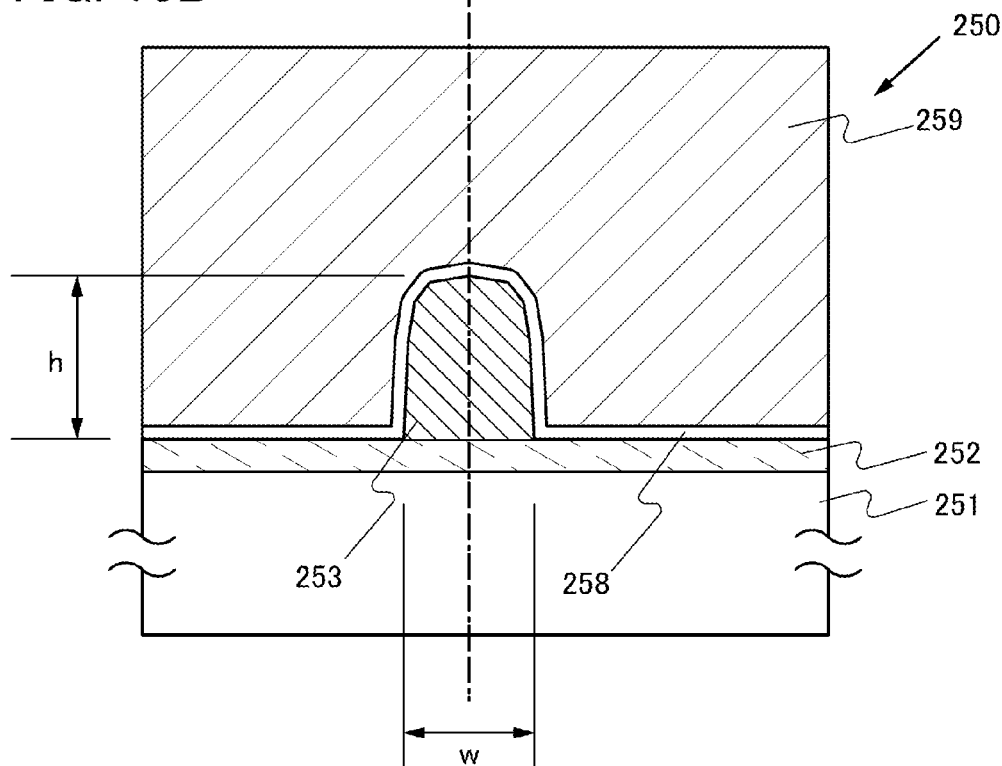

FIGS. 13A and 13B illustrate another example of the structure of the transistor which can be used as the transistor 101 and the transistor using an oxide semiconductor included in the circuit 108.

FIGS. 13A and 13B illustrate an example of a transistor having a three-dimensional structure. FIG. 13A illustrates an example of a cross section taken along dashed-dotted line in FIG. 13B. FIG. 13B illustrates an example of a cross section taken along dashed-dotted line in FIG. 13A.

A transistor 250 illustrated in FIG. 13A includes a base insulating film 252 over an insulating layer 251, an oxide semiconductor 253 over the base insulating film 252, a source electrode 254 in contact with a part of the oxide semiconductor 253, a drain electrode 255 in contact with another part of the oxide semiconductor 253, a spacer insulator 256 which is in contact with the source electrode 254 and has substantially the same planar shape as the source electrode 254, a spacer insulator 257 having substantially the same planar shape as the drain electrode 255, a gate insulating film 258 covering the oxide semiconductor 253, the spacer insulator 256, and the spacer insulator 257, and a gate electrode 259 overlapping with the oxide semiconductor 253 with the gate insulating film 258 provided therebetween.

The height h of the oxide semiconductor 253 is greater than or equal to 20 nm and less than or equal to 200 nm, e.g., greater than or equal to 30 nm and less than or equal to 50 nm. The width w thereof is greater than or equal to 5 nm and less than or equal to 50 nm, e.g., greater than or equal to 10 nm and less than or equal to 30 nm. The height h is 1 time or more and 20 times or less the width w, e.g., 2 times or more and 10 times or less the width w. The oxide semiconductor 253 has a linear shape or a flat-plate-like shape.

A value obtained by dividing the cross-sectional area of the oxide semiconductor 253 by the length of the oxide semiconductor 253 facing the gate insulating film 258 is set to 2 nm or less, for example. In that case, effectively, the same characteristics as a transistor using a film-like oxide semiconductor with a thickness of 2 nm or less are expected to be obtained.

As illustrated in FIG. 13B, a top surface and both side surfaces of the oxide semiconductor 253 are surrounded by the gate electrode 259. Thus, the transistor 250 has substantially the same functions as a transistor including an upper gate electrode and a lower gate electrode and has excellent on-state characteristics and off-state characteristics.

Forming a film-like oxide semiconductor with a thickness of 2 nm and controlling the purity of the oxide semiconductor with a thickness of 2 nm are difficult owing to a problem of a process; therefore, with a transistor including the oxide semiconductor, favorable characteristics cannot be obtained. In particular, semiconductor characteristics of a portion from an interface with the base insulating film 202 to a depth of 5 nm are not sufficient because silicon or the like contained in the base insulating film 202 is diffused into the oxide semiconductor 203 at the time of forming the oxide semiconductor 203 in the transistor 200 illustrated in FIGS. 12A and 12B, for example. Therefore, a transistor including a film-like oxide semiconductor with a thickness of 2 nm does not have sufficient characteristics.

In contrast, the transistor 250 illustrated in FIGS. 13A and 13B has favorable characteristics overall because silicon or the like is diffused from the base insulating film 252 into the oxide semiconductor 253 but characteristics of only part of the oxide semiconductor 253 deteriorate owing to the diffusion and characteristics of the other part of the oxide semiconductor 253 do not deteriorate.

EXAMPLE 3 OF TRANSISTOR USING OXIDE

Figure 14A:
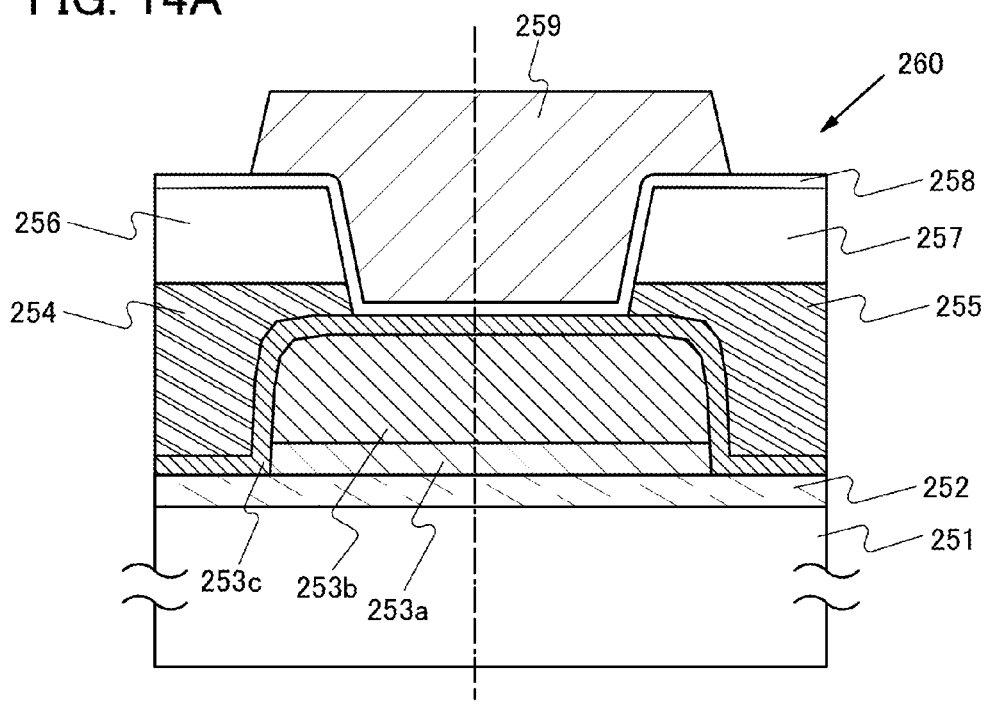
FIGS. 14A and 14B are schematic cross-sectional views illustrating an example of a transistor.
Figure 14B:
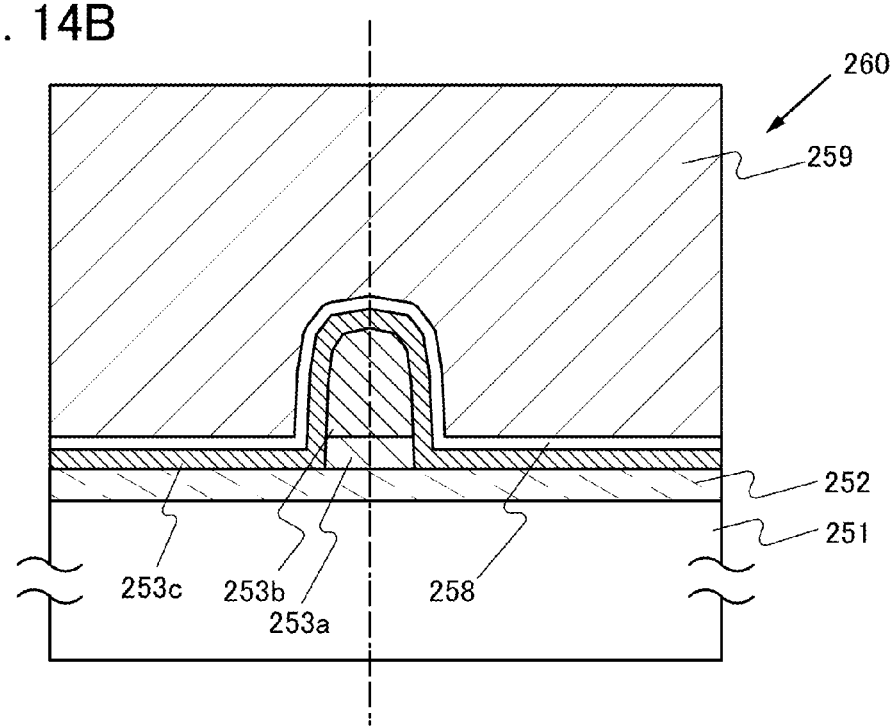

FIGS. 14A and 14B illustrate another example of the structure of the transistor which can be used as the transistor 101 and the transistor using an oxide semiconductor included in the circuit 108.

FIGS. 14A and 14B illustrate an example of a transistor having a three-dimensional structure. FIG. 14A illustrates an example of a cross section taken along dashed-dotted line in FIG. 14B. FIG. 14B illustrates an example of a cross section taken along dashed-dotted line in FIG. 14A.

A transistor 260 illustrated in FIG. 14A includes the base insulating film 252 over the insulating layer 251, an oxide semiconductor 253a over the base insulating film 252, an oxide semiconductor 253b over the oxide semiconductor 253a, a film-like oxide semiconductor 253c which covers the oxide semiconductor 253a, the oxide semiconductor 253b, and the base insulating film 252, the source electrode 254 in contact with a part of the oxide semiconductor 253c, the drain electrode 255 in contact with another part of the oxide semiconductor 253c, the spacer insulator 256 which is in contact with the source electrode 254 and has substantially the same planar shape as the source electrode 254, the spacer insulator 257 having substantially the same planar shape as the drain electrode 255, the gate insulating film 258 covering the oxide semiconductors 253a to 253c, the spacer insulator 256, and the spacer insulator 257, and the gate electrode 259 overlapping with the oxide semiconductor 253c with the gate insulating film 258 provided therebetween.

The transistor 260 is a modification of the transistor 250 in FIGS. 13A and 13B. The transistor 260 is different from the transistor 250 in that the oxide semiconductor 253 in the transistor 250 has a two-layer structure (the oxide semiconductor 253a and the oxide semiconductor 253b) (first feature) and the oxide semiconductor 253c is provided to cover the linear or flat-plate-like oxide semiconductor 253 (the oxide semiconductor 253a and the oxide semiconductor 253b) (second feature). A modification can be made by applying only one of the first feature and the second feature to the transistor 250.

The oxide semiconductor 253a and the oxide semiconductor 253c each have a wider bandgap, a lower electron affinity (a higher energy level of the bottom of the conduction band), and lower electron mobility than the oxide semiconductor 253b. For example, the difference between the electron affinity of the oxide semiconductor 253b and the electron affinity of each of the oxide semiconductor 253a and the oxide semiconductor 253c is set to be greater than or equal to 0.1 eV.

Such properties can be achieved by changing the percentages of metal elements of the oxide semiconductor. For example, in the case of an In—Ga—Zn-based oxide, by setting the percentage of Ga high and the percentage of In low, the bandgap becomes wide and the electron affinity becomes low. The oxide semiconductor 253a and the oxide semiconductor 253c may have the same composition or different compositions.

For example, the percentages of In, Ga, and Zn of the oxide semiconductor 253b are set to a composition within a range of 5% whose center is a composition where In is 44.4%, Ga is 22.2%, and Zn is 33.3%, and the percentage of In, Ga, and Zn of each of the oxide semiconductors 253a and 253c are set to a composition within a range of 5% whose center is a composition where In is 16.7%, Ga is 50%, and Zn is 33.3%. "A composition within a range of 5% whose center is a composition where In is 44.4%, Ga is 22.2%, and Zn is 33.3%" means that the square root of the square sum of the difference between the real percentages of elements and the percentages which are the centers of the elements (e.g., Zn is 33.3%) is 5% or less.

The first feature has an effect of preventing further deterioration of transistor characteristics due to entry of silicon or the like from the base insulating film 252. The height of the oxide semiconductor 253a is greater than or equal to 5 nm and less than or equal to 20 nm. Although the characteristics of a portion of the oxide semiconductor close to the interface deteriorate owing to silicon or the like which enters from the base insulating film 252 as described above, the adverse effect on the transistor can be further reduced by providing an oxide semiconductor which does not have excellent characteristics in the portion.

The second feature has an effect of reducing the adverse effect of silicon or the like which enters the oxide semiconductor from the gate insulating film 258 on the transistor. Since the oxide semiconductor 253c has a lower electron affinity, a channel is mainly formed in the oxide semiconductor 253b. That is, the channel is referred to as a buried channel. The semiconductor characteristics of the oxide semiconductor 253c deteriorate owing to entry of silicon or the like; however, the channel is not formed in the portion which silicon or the like enters, and thus, transistor characteristics are hardly affected.

This application is based on Japanese Patent Application serial no. 2014-111000 filed with Japan Patent Office on May 29, 2014, the entire contents of which are hereby incorporated by reference.

What is claimed is:

1. A semiconductor device comprising:
a circuit including a memory cell, the memory cell including a first capacitor and a first transistor;
a refresh timing determination unit including a second capacitor, a second transistor, and a comparator circuit;
a power management unit operationally connected to the circuit; and
a first power switch configured to control power supply to the circuit,
wherein each of the first transistor and the second transistor comprises an oxide semiconductor,
wherein one of a source and a drain of the first transistor is electrically connected to a first electrode of the first capacitor,
wherein one of a source and a drain of the second transistor is electrically connected to a first electrode of the second capacitor,
wherein a first input of the comparator circuit is configured to be supplied with a first potential which changes in accordance with a potential of the first electrode of the second capacitor and a second input of the comparator circuit is configured to be supplied with a second potential,
wherein the first power switch is configured to be controlled in accordance with an output potential of the comparator circuit, and
wherein a gate and the other of the source and the drain of the second transistor are electrically connected to the power management unit.

2. The semiconductor device according to claim 1,
wherein the first transistor and the second transistor have the same channel length and the same channel width, and
wherein the first capacitor and the second capacitor have the same capacitance.

3. The semiconductor device according to claim 2,
wherein an off-state resistance of the second transistor is lower than an off-state resistance of the first transistor.

4. The semiconductor device according to claim 1,
wherein the circuit is a memory or a processor.

5. The semiconductor device according to claim 1, further comprising:
a second power switch configured to control power supply to the power management unit,
wherein the second power switch is configured to be controlled in accordance with the output potential of the comparator circuit.

6. The semiconductor device according to claim 1,
wherein the refresh timing determination unit includes a logic gate, wherein the output potential of the comparator circuit is input to the logic gate, and
wherein the first power switch is configured to be controlled by an output potential of the logic gate.

7. The semiconductor device according to claim 1,
wherein the second input of the comparator circuit is electrically connected to the power management unit.

8. The semiconductor device according to claim 1,
wherein the refresh timing determination unit further comprises a third transistor and a diode,
wherein a gate of the third transistor is electrically connected to the first electrode of the second capacitor,
wherein one of a source and a drain of the third transistor, a first electrode of the diode, and the first input of the comparator circuit are electrically connected to one another,
wherein the other of the source and the drain of the third transistor is electrically connected to a first wiring, and
wherein a second electrode of the diode is electrically connected to a second wiring.

9. A semiconductor device comprising:
a circuit including a memory cell, the memory cell including a first capacitor and a first transistor;
a refresh timing determination unit including a second capacitor, a second transistor, and a comparator circuit;
a power management unit; and
a first power switch configured to control power supply to the circuit,
wherein each of the first transistor and the second transistor comprises an oxide semiconductor,
wherein the first capacitor is configured to be supplied with a potential corresponding to data through the first transistor,
wherein a first electrode of the second capacitor and one of a source and a drain of the second transistor are electrically connected to each other so that a potential of the first electrode of the second capacitor is substantially equal to a potential of the one of the source and the drain of the second transistor,
wherein the comparator circuit is configured to compare a first potential which changes in accordance with the potential of the first electrode of the second capacitor and a second potential,
wherein the first power switch is configured to be controlled by a first signal which changes in accordance with an output potential of the comparator circuit,
wherein the memory cell is configured to be refreshed when power is supplied to the circuit by turning on the first power switch, and
wherein the power management unit is configured to change a potential of the other of the source and the drain of the second transistor and a potential of a gate of the second transistor in accordance with a second signal transmitted from the circuit.

10. The semiconductor device according to claim 9,
wherein the first transistor and the second transistor have the same channel length and the same channel width, and
wherein the first capacitor and the second capacitor have the same capacitance.

11. The semiconductor device according to claim 9,
wherein an off-state resistance of the second transistor is lower than an off-state resistance of the first transistor.

12. The semiconductor device according to claim 9,
wherein a value of the second potential depends on whether power is supplied to the circuit or not.

13. The semiconductor device according to claim 9,
wherein the power management unit is configured to set the potential of the other of the source and the drain of the second transistor and the potential of the gate of the second transistor so that the potential of the other of the source and the drain of the second transistor is substantially equal to the potential of the gate of the second transistor.

14. The semiconductor device according to claim 9,
wherein the circuit is a memory or a processor.

15. The semiconductor device according to claim 9, further comprising:
a second power switch configured to control power supply to the power management unit,
wherein the second power switch is configured to be controlled by the first signal.

16. The semiconductor device according to claim 15, further comprising:
a third power switch configured to control power supply to the circuit,
wherein the third power switch is configured to be controlled independently of the first signal.

17. The semiconductor device according to claim 9,
wherein the power management unit is configured to be supplied with a third signal, and
wherein the power management unit is configured to change the second potential by the third signal so that the output potential of the comparator circuit is changed and the first power switch is turned on.

18. The semiconductor device according to claim 9,
wherein the refresh timing determination unit includes a logic gate,
wherein the output potential of the comparator circuit is input to the logic gate, and
wherein the first signal is an output potential of the logic gate.

19. The semiconductor device according to claim 9,
wherein the semiconductor device includes a second logic gate and the plurality of refresh timing determination units,
wherein an output of each of the plurality of refresh timing determination units is electrically connected to the second logic gate, and
wherein the first signal is an output potential of the second logic gate.

20. The semiconductor device according to claim 9,
wherein the first transistor and the second transistor each including:
a first oxide semiconductor;
a second oxide semiconductor over the first oxide semiconductor;
a third oxide semiconductor having a film shape and covering the first oxide semiconductor and the second oxide semiconductor;
a gate insulating film covering the third oxide semiconductor; and
a gate facing the third oxide semiconductor with the gate insulating film therebetween,
wherein the first oxide semiconductor and the second oxide semiconductor wholly have a linear shape or a flat-plate-like shape in which a height is one time or more as large as a width,
wherein a band gap of the first oxide semiconductor and a band gap of the third oxide semiconductor are each larger than a band gap of the second oxide semiconductor, and wherein an electron affinity of the first oxide semiconductor and an electron affinity of the third oxide semiconductor are each lower than an electron affinity of the second oxide semiconductor.

* * * * *